(12) United States Patent
Shimizu et al.

(10) Patent No.: US 6,538,326 B2
(45) Date of Patent: Mar. 25, 2003

(54) SEMICONDUCTOR DEVICE AND MANUFACTURING METHOD THEREOF

(75) Inventors: Hironobu Shimizu, Fukuyama (JP); Koji Fujimoto, Fukuyama (JP); Masahiro Horio, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/969,968

(22) Filed: Oct. 4, 2001

(65) Prior Publication Data

US 2002/0043723 A1 Apr. 18, 2002

(30) Foreign Application Priority Data

Oct. 16, 2000 (JP) .......................... 2000-315301
Jun. 29, 2001 (JP) .......................... 2001-200098

(51) Int. Cl.⁷ .............................................. H01L 23/48
(52) U.S. Cl. .................. 257/758; 257/759; 257/780; 257/784
(58) Field of Search ................ 257/758, 759, 257/760, 780, 781, 784

(56) References Cited

U.S. PATENT DOCUMENTS 5,597,737 A * 1/1997 Greer et al. ................ 438/612
5,989,991 A * 11/1999 Lien ........................... 438/612
6,127,715 A * 10/2000 Yamamoto et al. ........ 257/459
6,229,221 B1 * 5/2001 Kloen et al. ................ 257/784
6,306,749 B1 * 10/2001 Lin ............................. 438/612

FOREIGN PATENT DOCUMENTS

JP   4-62855 A    2/1992
JP   5-251573 A   9/1993
JP   2694252 B2   9/1997

OTHER PUBLICATIONS

Wolf, S., Silicon Processing for the VLSI Era, vol. 2, Lattice Press, 1990, pp. 204–206.*

* cited by examiner

Primary Examiner—T. N. Quach
(74) Attorney, Agent, or Firm—Nixon & Vanderhye, P.C.

(57) ABSTRACT

In a semiconductor device, a second wiring layer 7 is formed via an inter-layer insulation film 6 on a first wiring layer 2 connected to an active region of a silicon substrate 1, and a bonding pad 14 is placed on the second wiring layer 7 via a protection film 8 and a polyimide film 10, so as to overlie the active region of the silicon substrate 1. The second wiring layer 7 has a plurality of wires 7a and 7b in a region underlying the bonding pad 14: the wire 7a is joined to the bonding pad 14 via opening sections 9 and 11 provided in the protection film 8 and the polyimide film 10, respectively, and the protection film 8 and the polyimide film 10 are placed between the wires 7b and the bonding pad 14. This structure can provide a semiconductor device having multiple wiring layers and a bonding pad located at a position overlying an active region of a semiconductor substrate, which can simplify a manufacturing process and reduce a device size, and enhances the flexibility in providing the wiring between semiconductor elements and in the location of the bonding pad, and a manufacturing method of such a semiconductor device.

18 Claims, 15 Drawing Sheets

F I G. 1 4
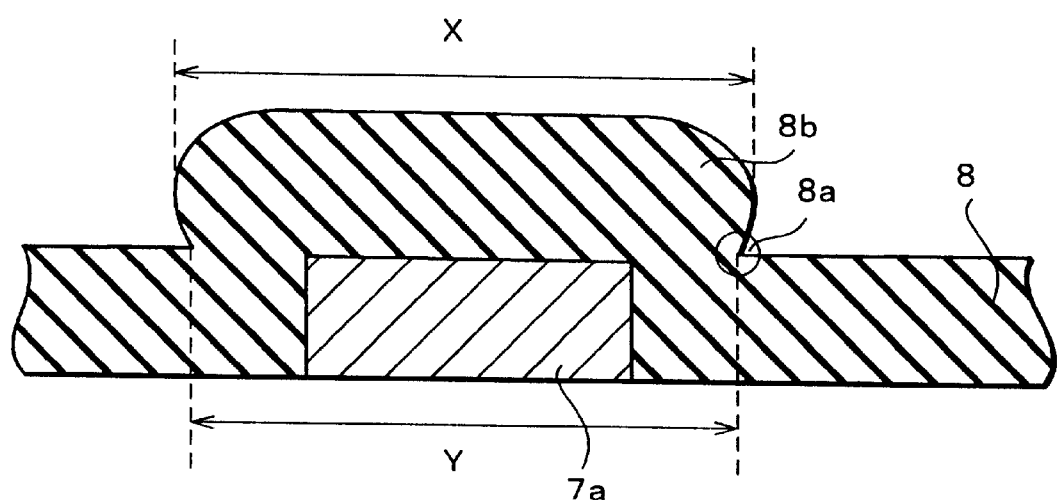

SEMICONDUCTOR DEVICE AND MANUFACTURING METHOD THEREOF

FIELD OF THE INVENTION

The present invention relates to a semiconductor device used in a semiconductor integrated circuit and a manufacturing method thereof, and more particularly concerns a semiconductor device which is provided with a bonding pad formed above an active region on a surface of a semiconductor substrate and a manufacturing method thereof.

BACKGROUND OF THE INVENTION

There is a tendency in a semiconductor integrated circuit that its integration level (the number of semiconductor elements integrated on a chip) has been increased and its chip size has become larger, in accordance with the progress in manufacturing an electronic device with higher functions and performance which is equipped with semiconductor integrated circuits. On the other hand, in response to the need for a smaller package containing a semiconductor integrated circuit, a chip has been downsized by reducing the processing size (reducing the design rule) and by miniaturizing the package containing the semiconductor integrated circuit.

A semiconductor integrated circuit chip can be roughly divided into two regions: one is an operation region (also referred to as an active region in some cases) inside the chip, and the other is a bonding pad region formed on a surface of the chip. The operation region includes a region on which semiconductor elements such as a transistor, etc. are provided (an active region), and a region of metal wiring connecting the semiconductor elements (a wiring region). The bonding pad region is a region on which bonding pads are formed. A bonding pad is an electrode for electrical connection to an external section by, for example, wire bonding using a fine gold wire, for the input/output of a signal to/from the semiconductor integrated circuit and for other purposes. Generally, the bonding pads are provided on the perimeter of a chip, avoiding a region overlying the active region of a semiconductor substrate. This is to prevent stress caused at the bonding pad when carrying out bonding such as wire bonding due to mechanical pressure, etc. applied to the bonding pad, from being applied to the action region constituting the semiconductor element. In general, the bonding pad is a rectangle in which the length of one side is about 50 μm to 100 μm, and a plurality of the bonding pads are placed on the perimeter of the chip at intervals about 10 μm to 20 μm.

Formerly, it was enough to provide one layer of metal wiring for connecting semiconductor elements on a semiconductor integrated circuit chip. However, in accordance with the development in functions and performance and the increase in the integration level, the wiring has become longer and complicated, causing defects such that a signal cannot be transmitted correctly. To solve such a problem, a multilayer wiring structure, in which a plurality of wiring layers are laminated via inter-layer insulation films, has been proposed. This structure increase flexibility and facilitates the improvement in the function and performance of semiconductor integrated circuits, and the improvement of their integration level.

Meanwhile, as semiconductor integrated circuits come to have higher functions and performance, the number of terminals used for input/output, etc. increases accordingly, reaching several hundreds to nearly one thousand. Since one bonding pad is required for one terminal, the number of bonding pads required also increases in response to the increase in the number of terminals, and several hundreds to nearly one thousand bonding pads are required. Along with such an increase in the number of bonding pads, the area of the bonding region on a chip surface is increasing. Therefore, chip size reduction in a semiconductor integrated circuit (miniaturization of a semiconductor integrated circuit) cannot be achieved, failing to satisfy the need for the miniaturization of an electronic device equipped with a semiconductor integrated circuit.

As a method for chip size reduction, a method has been proposed in which a bonding pad, conventionally provided on the perimeter of a chip to avoid a region overlying an active region of a semiconductor substrate, is provided in an region overlying an active region of a semiconductor substrate (above the active region). (Hereinafter, a bonding pad provided in a region overlying an active region of a semiconductor substrate is referred to as an area pad.)

First, referring to FIG. 8, an example for forming an area pad in a semiconductor device with a two-layer wiring structure disclosed in Japanese Unexamined Patent Publication No. 1-91439/1989 (Tokukaihei 1-91439, published on Apr. 11, 1989) [Japanese Patent No. 2694252] will be described.

As shown in FIG. 8, a first Al wiring layer 102 is formed on a Si substrate (semiconductor substrate) 101. On the first Al wiring layer 102, inter-layer insulation films 103 to 105 (a plasma nitride film 103, an NSG 104, and a PSG 105) are provided, then a through hole is formed through the inter-layer insulation films 103 to 105 by means of patterning and etching. A second Al wiring layer 106 is formed on the inter-layer insulation films 103 to 105, and a final passivation film 107 is formed on the second Al wiring layer 106.

On the final passivation film 107, an opening section (pad opening section) 110 is formed above an active region (not shown). With this structure, an electrode pad is formed above the active region.

Therefore, in the foregoing semiconductor device, it can be considered that an exposed section 106a in the second Al wiring layer 106 (the part at the opening section 110) functions as an electrode pad formed above the active region, that is, as an area pad.

Next, referring to FIG. 9, an example for forming a bonding pad in a semiconductor device with a three-layer wiring structure disclosed in Japanese Unexamined Patent Publication No. 4-62855/1992 (Tokukaihei 4-62855, published on Feb. 27, 1992) will be described.

A first wiring layer 203 is formed on a silicon substrate 201 on which an element (not shown) is provided, via an insulation film 202. A second wiring layer 209 is formed on the first wiring layer 203 via inter-layer insulation films 205 to 207 (an insulation film 205, a glass-coated film 206, and an insulation film 207). A third wiring layer 215 is formed on the second wiring layer 209 via inter-layer insulation films 212 to 214. The third wiring layer 215 is connected with the second wiring layer 209 via through holes formed at predetermined positions in the inter-layer insulation films 212 to 214. A protection film 210 is formed on the third wiring layer 215.

Further, to relieve stress during wire bonding, a section 203a of the first wiring layer 203, which is a section underlying a bonding pad section 215a (a section below the bonding pad section 215a), is processed to have a virtually same shape with that of the bonding pad section 215a.

In the foregoing semiconductor device, the process for forming the bonding pad section 215a is completed by forming a hole 211 for bonding in the protection film 210. Therefore, it can be considered that an exposed section in the third wiring layer 215 (the part at the hole 211 for bonding) becomes the bonding pad section 215a for electrically connecting the semiconductor device to an external section.

Further, a section 209a of the second wiring layer 209, which is a section underlying the bonding pad section 215a (a section below the bonding pad section 215a), is divided into a plurality of parts by the inter-layer insulation films 212 to 214. Therefore, in the structure disclosed in Japanese Unexamined Patent Publication No. 4-62855/1992, it can be considered that, in the second wiring layer 209, there are a plurality of wires of the section 209a, which is the section underlying the bonding pad section 215a, in a region underlying the bonding pad section 215a.

Next, referring to FIG. 10, an example for forming an area pad in a semiconductor device with a two-layer wiring structure disclosed in Japanese Unexamined Patent Publication No. 5-251573/1993 (Tokukaihei 5-251573, published on Sep. 28, 1993) will be described.

As shown in FIG. 10, a base 302 and an emitter 303 are formed on a collector (silicon substrate) 301, and on the base 302 and the emitter 303, a first aluminum wiring 306 is formed via a silicon oxide film 304 and an silicon nitride film 305.

On the first aluminum wiring 306, inter-layer insulation films 307 to 309 are laminated, on which a second aluminum wiring 310 is formed. A section 310a of the second aluminum wiring 310 is used as a bonding pad for bonding a bonding wire 311. This bonding pad is located above the base 302, serving as an area pad.

The inter-layer insulation films 307 to 309 have a laminated structure in which a polyimide film 308 is sandwiched between plasma silicon films 307 and 309, so as to prevent the inter-layer insulation films from being cracked due to the stress during bonding.

However, in the conventional technique disclosed in Japanese Unexamined Patent Publication No. 1-91439/1989, the second Al wiring layer 106 is used not only as wiring for electrically connecting to the wiring of the first Al wiring layer 102, but also as an area pad. Therefore, when using the second Al wiring layer 106 to form wiring between the semiconductor elements which should be insulated from the area pad, the wiring has to be formed so as to be bypassed around the area pad, in such a manner to avoid the area pad.

A semiconductor device shown in FIGS. 11A and 11B is also known as a conventional technique similar to that disclosed in Japanese Unexamined Patent Publication No. 1-91439/1989. FIG. 11A is a schematic plan view showing an area pad having a gold bump and wiring formed in proximity to the area pad, and FIG. 11B is a sectional view taken along a line X–X' of FIG. 11A. In FIG. 11A, an inter-layer insulation film and a surface protection film are omitted, and only the area pads, the wiring, and the opening sections in the surface protection film are shown for easier understanding of the state of the wiring.

As shown in FIGS. 11A and 11B, a second wiring layer 403, which is made of a metal, is formed on a first wiring layer 401, made of a metal, via an inter-layer insulation film 402. On the second wiring layer 403, a surface protection film 404 having an opening section 404a is formed, and via the opening section 404a, a gold (Au) bump 405 is joined to a part of the second wiring layer 403. In this case, the part of the second wiring layer 403 joined to the gold bump 405 and the gold bump 405 are used as an area pad. The first wiring layer 401 has a plurality of wires 401a in a region below the gold bump 405, which are the wires for connecting a semiconductor element to an external section.

Although not shown, a semiconductor substrate having an active region (a region in which a semiconductor element is formed) is provided below the first wiring layer 401, that is, below the gold bump 405.

In this structure, in the connection between the second wiring layer 403 and the gold bump 405, the second wiring layer 403 below the gold bump 405 is formed so as to have virtually the same size (cross-sectional area) with that of the gold bump 405, which serves as an area pad, and the opening section 404a in the surface protection film 404 located between the second wiring layer 403 and the gold bump 405 is also formed so as to have virtually the same size (cross-sectional area) with that of the gold bump 405. Thus, in the second wiring layer 403, there is only one wire joined with the gold bump 405 in a region below the gold bump 405. Therefore, wires 403a connecting semiconductor elements, which should be insulated from the gold bump 405 (the two wires shown in the lower part of FIG. 11B), are subject to limitations on installed location, and as shown in FIG. 11A, they have to be formed so as to be bypassed around regions underlying the gold bump 405, in such a manner to avoid the regions. Thus, there is a need to reserve a wiring region for the bypassed wires 403a of the second wiring layer 403 in an area outside the region below the gold bump 405, requiring extra space for the wiring region on a chip. As a result, the effect of chip size reduction given by an area pad is lessened.

The gold bump 405 is generally formed such that its surface facing the second wiring layer 403 is a rectangle in which the length of one side is around 50 $\mu$m to 100 $\mu$m. On the other hand, the width of a wire is generally not more than 1 $\mu$m. Thus, if the gold bump 405 is provided just above the active region of the semiconductor element, approximately 10 to 20 wires should be bypassed. As the number of the gold bump 405 increases, limitations on wiring become severer and more complicated, and the location for forming the gold bump 405 is also more limited.

These problems also occur in the conventional technique disclosed in Japanese Unexamined Patent Publication No. 1-91439/1989. Therefore, in the structure disclosed in Japanese Unexamined Patent Publication No. 1-91439/1989, there is a possibility that the effect given by an area pad cannot be fully utilized in practical use.

Besides, in the semiconductor device disclosed in Japanese Unexamined Patent Publication No. 4-62855/1992, although the position of an active region on the silicon substrate 201 is not clear, even if the active region on the silicon substrate 201 is supposed to be placed at a position underlying the bonding pad, that is, the semiconductor device is supposed to be structured to have an area pad, there is a following problem.

Specifically, in the structure disclosed in Japanese Unexamined Patent Publication No. 4-62855/1992, the plurality of wires of the section 209a of the second wiring layer 209, the section underlying the bonding pad section 215a, are all electrically connected to the bonding pad section 215a.

Consequently, the plurality of wires of the section 209a of the second wiring layer 209, the section underlying the bonding pad section 215a, can be used only as the wires to be connected to the bonding pad section 215a. Therefore, the plurality of wires of the section 209a which underlies the bonding pad section 215a cannot be used as the wires between semiconductor elements which should be insulated from the bonding pad section 215a.

Besides, also in the semiconductor device disclosed in Japanese Unexamined Patent Publication No. 5-251573/1993, a part of the second aluminum wiring 310 is used as an area pad, as in the case of the conventional technique disclosed in Japanese Unexamined Patent Publication No. 1-91439/1989. Thus, it is impossible to place the wiring between semiconductor elements which should be insulated from an area pad, just below the area pad. Therefore, it is required that the wiring between semiconductor elements formed by the second aluminum wiring 310, which should be insulated from the area pad, is placed so as to be bypassed to avoid a region below the area pad.

FIGS. 12A and 12B show an example of a conventional technique which can solve the problem. FIG. 12A is a schematic plan view showing an area pad having a gold bump and wiring formed in proximity to the area pad, and FIG. 12B is a sectional view taken along a line Y–Y' of FIG. 12A. In FIG. 12A, a first inter-layer insulation film, a second inter-layer insulation film, and a surface protection film are omitted, and only the area pads, the wiring, and the opening sections in the surface protection film are shown for easier understanding of the state of the wiring.

As shown in FIGS. 12A and 12B, a second wiring layer 503, which is made of a metal, is formed on a first wiring layer 501, made of a metal, via a first inter-layer insulation film 502. On the second wiring layer 503, a second inter-layer insulation film 504 is provided, in which a via hole 504a for electrical connection is formed. On the second inter-layer insulation film 504, a third wiring layer 505 is formed by metal deposition processing. Further, on the third wiring layer 505, a surface protection film 506 having an opening section 506a is formed, and via the opening section 506a, a gold (Au) bump 507 is joined to a part of the third wiring layer 505. In this case, the part of the third wiring layer 505 joined to the gold bump 507 and the gold bump 507 are used as an area pad.

Although not shown, a semiconductor substrate having an active region (a region in which a semiconductor element is formed) is provided below the gold bump 507, that is, below the first wiring layer 501. The second wiring layer 503 and the third wiring layer 505 are connected via the via hole 504a formed in the second inter-layer insulation film 504 in an area outside a region underlying the gold bump 507.

Further, in this structure, the third wiring layer 505 below the gold bump 507 is formed so as to have virtually the same size (cross-sectional area) with that of the gold bump 507, and the opening section 506a in the surface protection film 506 located between the gold bump 507 and the third wiring layer 505 is also formed so as to have virtually the same size (cross-sectional area) with that of the gold bump 507.

According to the structure shown in FIGS. 12A and 12B, it is possible to place a plurality of wires of the second wiring layer 503 in the region below the gold bump 507.

However, in the foregoing structure, the second inter-layer insulation film 504 and the third wiring layer 505 are further required, in addition to the structure shown in FIGS. 11A and 11B. Thus, in the process for manufacturing the semiconductor device shown in FIGS. 12A and 12B, it is required to add a process for depositing and processing the second inter-layer insulation film 504 and a process for depositing and processing the third wiring layer 505, to the process for manufacturing the semiconductor device shown in FIGS. 11A and 11B. Especially, it is required to add a photolithography process and an etching process, resulting in a decline in manufacturing efficiency and an increase in chip cost.

SUMMARY OF THE INVENTION

The present invention relates to a semiconductor device used in a semiconductor integrated circuit, etc., which includes a bonding pad located in a region overlying an active region of a semiconductor element (above the active region) and made up of a gold bump, etc., and a plurality of wires, and its object is to provide a semiconductor device which can simplify a manufacturing process, reduce the device's size (chip size), improve the flexibility in the position for placing the bonding pad and the flexibility in providing wiring between semiconductor elements, and a manufacturing method for such a semiconductor device.

To achieve the foregoing object, a semiconductor device in accordance with the present invention is characterized by including:

a semiconductor substrate having an active region where a semiconductor element is formed;

a first wiring layer formed on the semiconductor substrate and electrically connected with the active region;

a second wiring layer formed on the first wiring layer via an inter-layer insulation film; and a bonding pad for electrical connection with an external section, at least a part of which is formed so as to overlie the active region, wherein the second wiring layer has a plurality of wires in a region underlying the bonding pad, in which a part of the wires is joined to the bonding pad, and other wires are insulated from the bonding pad by an insulation film formed between the other wires and the bonding pad.

According to the foregoing structure, a plurality of wires can be provided in the region underlying the bonding pad, where only one wire can be provided in the semiconductor device with a two-layer structure having a conventional area pad as shown in FIGS. 8, 10, 11A and 11B. Among the plurality of wires, the wires except that joined to the bonding pad are insulated from the bonding pad by the insulation film.

With this structure, it becomes possible to provide wires which should be insulated from the bonding pad, which are bypassed to avoid a region below the bonding pad in the semiconductor device with a two-layer structure having a conventional area pad, in the region underlying the bonding pad (in the region below the bonding pad) For example, when the bonding pad is provided in a region overlying an active region (a region above an active region) of each of three adjacent semiconductor elements in a semiconductor integrated circuit, a second wire connecting the semiconductor elements at the both ends can be provided in a region underlying the bonding pad in the middle. Thus, since there is no need to bypass wires, the area of the wiring region can be reduced, and chip size reduction can be achieved.

Further, there is no need in this structure to design wiring between semiconductor elements, etc. considering the position of the bonding pad, or, on the contrary, to specify the position of the bonding pad considering the wiring between the semiconductor elements, etc., which enhances the flexibility in providing the wiring between the semiconductor elements, etc. as well as the flexibility in the location of the bonding pad.

Besides, compared with the conventional semiconductor device in which the bonding pad is provided on the perimeter of a chip, where no wires are provided, so as to avoid an active region, considering the position of the wires between the semiconductor elements, etc., there is no need in this structure to provide a region exclusive for the bonding pad on the perimeter of a chip (a region where no wires are provided). Therefore, compared with the conventional semiconductor device, the area of the wiring region can be reduced, and chip size reduction can be achieved in the foregoing structure.

Furthermore, compared with the semiconductor device with a three-layer structure having the conventional area pad as shown in FIGS. 12A and 12B, the bonding pad can be directly joined to the second wiring layer without a third wiring layer in between in the foregoing structure, which eliminates the need for the third wiring layer and a protection film covering the third wiring layer. Therefore, processes for manufacturing the third wiring layer and the protection film covering the third wiring layer can be omitted, and the manufacturing process can be shortened. Consequently, production efficiency can be improved and manufacturing cost can be reduced.

Therefore, according to the foregoing structure, productivity improvement and cost reduction can be achieved, the device can be downsized, and the flexibility in providing the wiring between semiconductor elements, etc. and in the location of the bonding pad can be enhanced.

Incidentally, the wordings "overlie" and "underlie" mean that an orthogonal projection of a section projected on a semiconductor substrate matches that of another section projected on the same semiconductor substrate.

To achieve the foregoing object, a method for manufacturing a semiconductor device in accordance with the present invention is characterized by including the steps of:

forming a semiconductor element on a semiconductor substrate;

forming a first wiring layer so as to be partially joined to the semiconductor element;

forming an inter-layer insulation film having a via hole, on the first wiring layer;

forming a second wiring layer on the inter-layer insulation film and in the via hole;

forming an insulation film on the second wiring layer;

forming an opening section in the insulation film; and forming a bonding pad for electrical connection with an external section, by forming a metal film on the insulation film and in the opening section, wherein a plurality of wires are formed in the step of forming the second wiring layer;

the insulation film is formed so as to cover the plurality of wires in the step of forming the insulation film;

the opening section is formed so as to expose only a part of the plurality of wires covered with the insulation film, in the step of forming the opening section; and the bonding pad is formed so as to at least partially overlie the semiconductor element, and to overlie at least one of the wires covered with the insulation film, in the step of forming the bonding pad.

According to the foregoing method, a semiconductor device in which a plurality of wires are provided in a region underlying the bonding pad, where only one wire can be provided in a semiconductor device with a two-layer structure having a conventional area pad, can be obtained. Among the plurality of wires, those except the wire joined to the bonding pad is covered with the insulation film, so they are insulated from the bonding pad.

With this method, wires to be insulated from the bonding pad can be placed in the region underlying the bonding pad (the region below the bonding pad). Thus, since there is no need to bypass the wires, the area of the wiring region can be reduced, and chip size reduction can be achieved. Further, the flexibility in providing the wiring between the semiconductor elements, etc. and the flexibility in the location of the bonding pad can be enhanced.

Compared with the conventional semiconductor device in which the bonding pad is provided on the perimeter of a chip, where no wires are provided, so as to avoid an active region, considering the position of the wires between the semiconductor elements, etc., the area of the wiring region can be reduced, and chip size reduction can be achieved by the foregoing method.

Furthermore, according to the foregoing method, the bonding pad can be directly joined to the second wiring layer without a third wiring layer in between, which eliminates the need for the third wiring layer and a protection film covering the third wiring layer. Therefore, processes for manufacturing the third wiring layer and the protection film covering the third wiring layer can be omitted, and the manufacturing process can be shortened. Consequently, production efficiency can be improved and manufacturing cost can be reduced.

Therefore, according to the foregoing method, productivity improvement and cost reduction can be achieved, the device can be downsized, and the flexibility in providing the wiring between semiconductor elements, etc. and in the location of the bonding pad can be enhanced.

For a fuller understanding of the nature and advantages of the invention, reference should be made to the ensuing detailed description taken in conjunction with the accompanying drawings.

BRIEF DESCRIPTION OF THE DRAWINGS

FIG. 14 is a fragmentary cross-sectional view showing a magnified overhang-shape convex section of a protection film in the semiconductor integrated circuit in FIG. 13A.

DESCRIPTION OF THE PREFERRED EMBODIMENTS

First Embodiment

Referring to FIGS. 1 through 7, the following description will describe an embodiment of the present invention.

Detailed description will be given below, taking a semiconductor integrated circuit having a MOS (Metal Oxide Semiconductor) transistor formed on a silicon (Si) substrate as an example of an embodiment of a semiconductor device in accordance with the present invention. However, in the present invention, there are no particular limitations in a semiconductor material constituting a semiconductor substrate, and in the type and combination of semiconductor elements formed on the semiconductor substrate. Incidentally, in the present specification, a region on a semiconductor substrate where a semiconductor element is formed is referred to as an active region. Besides, in the present specification, the wordings "overlie" and "underlie" mean that an orthogonal projection of a section projected on a semiconductor substrate matches that of another section projected on the same semiconductor substrate.

Figure 1:
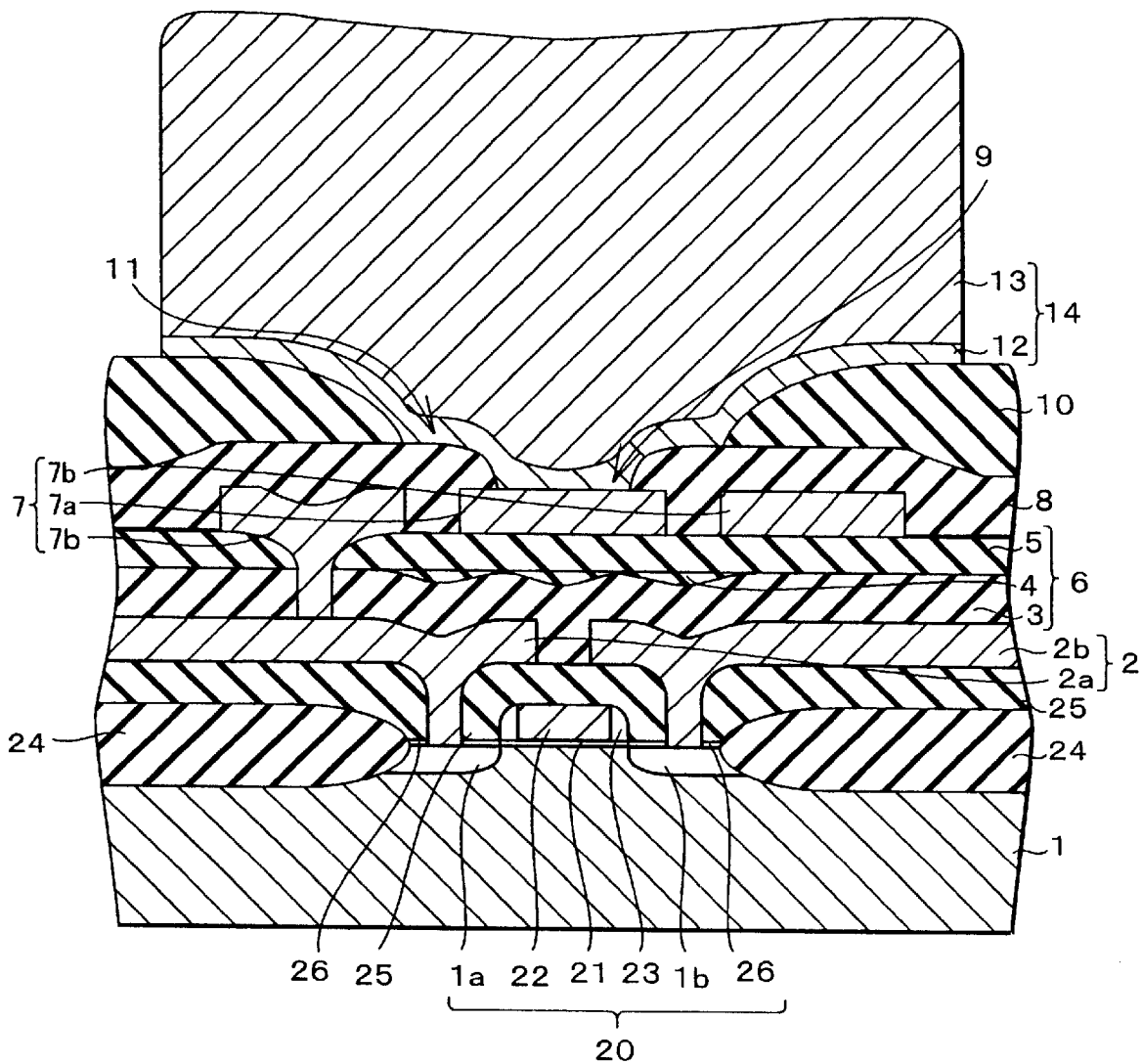
FIG. 1 is a cross-sectional view showing a schematic structure of a semiconductor integrated circuit as one embodiment of a semiconductor device in accordance with the present invention.

FIG. 1 is a schematic cross-sectional view of a section corresponding to one semiconductor element in a semiconductor integrated circuit as one embodiment of a semiconductor device in accordance with the present invention. Explanation will be given below on the section corresponding to one semiconductor element.

As shown in FIG. 1, a semiconductor integrated circuit of the present embodiment includes a silicon substrate (semiconductor substrate) 1 having an active region where a semiconductor element 20 is formed; a first wiring layer 2 formed on the silicon substrate 1 and electrically connected with the active region; a second wiring layer 7 formed on the first wiring layer 2 via an inter-layer insulation film 6; and a bonding pad 14 for electrical connection with an external section, at least a part of which is formed at a position overlying the active region (above the active region).

The semiconductor element 20 of the present embodiment is a MOS transistor. The semiconductor element 20 is made up of an impurity diffusion layer 1a formed on a surface layer of the silicon substrate 1 to serve as a source region; an impurity diffusion layer 1b formed on a surface layer of the silicon substrate 1 to serve as a drain region; oxide films 26 formed on the impurity diffusion layers 1a and 1b (the films to reduce the damage when ion is implanted to the source and drain regions); a gate insulation film 21 formed on the silicon substrate 1; a polysilicon gate electrode 22; and a side wall protection film 23 formed on the side of the polysilicon gate electrode 22. In the semiconductor element 20, a region between the impurity diffusion layers 1a and 1b in the silicon substrate 1 serves as a channel region. Therefore, in the silicon substrate 1 of the present embodiment, the impurity diffusion layers 1a and 1b and the channel region between them constitute the active region. A region in the silicon substrate 1 except the region where the semiconductor element 20 is formed (a region except the active region) is an element isolation region where an insulation film 24 for element isolation is formed for electrically isolating the semiconductor element 20 from another semiconductor element.

On the semiconductor element 20 formed in the active region of the silicon substrate 1 and on the insulation films 24 for element isolation, an insulation film 25 with a predetermined thickness is formed. At predetermined positions in the insulation film 25 (positions corresponding to those of the impurity diffusion layers 1a and 1b), contact holes are opened so as to electrically connect the first wiring layer 2 with the impurity diffusion layers 1a and 1b.

The first wiring layer 2 is composed of a single-layer or multi-layer conductive film made of a conductive material such as aluminum. The first wiring layer 2 includes a plurality of wires 2a and 2b formed on the insulation film 25. The wire 2a is electrically connected with the impurity diffusion layer 1a via the contact hole, and the wire 2b is electrically connected with the impurity diffusion layer 1b via the contact hole.

On the first wiring layer 2, the inter-layer insulation film 6 for insulating the first wiring layer 2 from the second wiring layer 7 is composed of a single-layer or multi-layer insulation film. In the inter-layer insulation film 6 provided is a via hole for electrically connecting the first wiring layer 2 with the second wiring layer 7.

In this case, the inter-layer insulation film 6 has a function to planarize a surface on which the first wiring layer 2 is formed. The inter-layer insulation film 6 may be a single-layer insulation film, but in the present embodiment, a laminated film made of a plurality of insulation films is adopted, since the laminated film is preferable to cover a rough surface of the first wiring layer 2 formed with a first conductive film, and to planarize the foregoing surface.

In the present embodiment, a laminated film including an SOG (Spin On Glass) film 4 is used as the inter-layer insulation film 6. The SOG film 4 is a silicon oxide film formed by the coating method (SOD: Spin On Deposition), and it is also referred to as a coated silicon oxide film. The SOG film 4 can be formed by an easy method using spin coating (the coating method), and it can be formed thicker at a concave portion than at a convex portion of the coated surface, owing to the surface tension. Therefore, the SOG film 4 is an insulation film very effective for planarizing the foregoing surface. However, when using the SOG film 4 alone as the inter-layer insulation film 6, there is a possibility that a trace quantity of moisture, etc. contained in the SOG film 4 might exude from the SOG film 4, react with a metal wiring material such as aluminum which constitutes the first wiring layer 2 and the second wiring layer 7, and cause problems such as a break in the metal wiring material. Thus, there are some cases where the reliability of the wiring of the first wiring layer 2 and the second wiring layer 7 is impaired.

To avoid such a problem, in the present embodiment, when forming the inter-layer insulation film 6, first, the SOG film 4 is formed all over the surface where the first wiring layer 2 is formed, then etching is provided on all the surface of the SOG film 4 by means of a technique so called etch-back, so as to leave the SOG film 4 only at concave portions on the surface of a silicon oxide film 3 to obtain a planarized surface. Further, to avoid the foregoing problem, the present embodiment adopts a method in which silicon oxide films 3 and 5, formed by the CVD (Chemical Vapor Deposition) method, sandwich the SOG film 4, so as to block the exudation of moisture, etc. from the SOG film 4. That is, the present embodiment adopts a sandwich structure in which the SOG film 4, being etch-backed, is sandwiched between the silicon oxide films (CVD oxide films) 3 and 5 formed by the CVD method.

The second wiring layer 7 is also composed of a single-layer or multi-layer conductive film made of a conductive material such as aluminum. The second wiring layer 7 has a plurality of wires 7a and 7b which are insulated from one another, in a region underlying the bonding pad 14 (a region below the bonding pad 14). A part of the second wiring layer 7 is connected with a part of the first wiring layer 2 via the via hole in the inter-layer insulation film 6. In this case, the wire 7b, one of the wires of the second wiring layer 7, is electrically connected with the wire 2a, one of the wires of the first wiring layer 2, via the via hole in the inter-layer insulation film 6.

Between the second wiring layer 7 and the bonding pad 14 are formed a protection film 8 and a polyimide film 10, in which an opening section 9 (a first opening section) and an opening section 11 (a second opening section) are formed, respectively. Among the plurality of the wires 7a and 7b of the second wiring layer 7, the wire 7a is joined with the bonding pad 14 via the opening sections 9 and 11 formed in the protection film 8 and the polyimide film 10, respectively. On the other hand, the protection film 8 and the polyimide film 10 are provided between the other two wires 7b and the bonding pad 14. That is, the opening sections 9 and 11 are formed in a part of the region where the protection film 8 and the polyimide film 10 underlie the bonding pad 14 (the region just below the bonding pad 14). More specifically, the opening sections 9 and 11 are formed only at a position corresponding to the position of the wire 7a of the second wiring layer 7, in the foregoing region. That is, they are not formed above wiring regions where the wires 7b at the both ends of the second wiring layer 7 are placed. Therefore, the cross-sectional area of the opening section 9 at the end on a side of the second wiring layer 7 (the area of a cross section along a face parallel to the silicon substrate 1), that is, the area of a joined surface between the second wiring layer 7 and the bonding pad 14, is not virtually the same as the area of the upper surface of the bonding pad 14 (the rear surface of the surface facing the silicon substrate 1), unlike the structures in the conventional techniques shown in FIGS. 11A, 11b and FIGS. 12A, 12B, but much smaller than the area of the upper surface of the bonding pad 14.

The protection film 8 not only protects the surface of the semiconductor integrated circuit, but also serves as an insulation film for insulating the bonding pad 14 from the wires 7b of the second wiring layer 7 except the wire 7a in the middle, and it is composed of a single-layer inorganic insulation film. The protection film 8 protects the second wiring layer 7 from moisture, and has a function to provide an insulation film with high mechanical strength.

The opening section 9 is provided for joining the lower surface of the bonding pad 14 (the surface on the side of silicon substrate 1) to the wire 7a in the middle of the second wiring layer 7, for the purpose of establishing electric connection between the first wiring layer 2 and the second wiring layer 7 and an external section. The cross section of the opening section 9 at the end on the side of the second wiring layer 7 (the cross section along a face parallel to the silicon substrate 1) may be sufficiently provided as long as the wiring region for placing the insulated wires 7b at the both ends of the second wiring layer 7 can be obtained in the region underlying the bonding pad 14. It is preferable that the joined surface between the second wiring layer 7 and the bonding pad 14, that is, the cross section of the opening section 9 at the end on the side of the second wiring layer 7, has a smaller area, since such a structure allows the wiring region for placing the insulated wires 7b at the both ends of the second wiring layer 7 to have a larger area. However, the cross section of the opening section 9 at the end on the side of the second wiring layer 7 should have a cross-sectional area enough to obtain a permissible resistance value in the electric connection between the bonding pad 14 and the wire 7a in the middle of the second wiring layer 7. That is, the bonding pad 14 and the wire 7a in the middle of the second wiring layer 7 should be connected so that the difference in their resistance values becomes low enough. Therefore, it is more preferable that the cross section of the opening section 9 at the end on the side of the second wiring layer 7 has a diameter close to the width of the wire in accordance with the design rule for designing integrated circuits (the width of the wire of the second wiring layer 7). Specifically, it is more preferable that the cross-sectional area of the opening section 9 at the end on the side of the second wiring layer 7 is within a range of 60% to 100% of the value obtained by squaring the width of the wire of the second wiring layer 7.

In the present embodiment, it is determined that the dimensions of the cross section of the bonding pad 14 along a face parallel to the silicon substrate 1 are 35 μm ×50 μm, and the dimensions of the cross section of the opening section 9 at the end on the side of the second wiring layer 7 are 0.5 μm×0.5 μm, according to the 0.5 μm design rule.

A plurality of opening sections 9 may be provided as long as the insulation between the bonding pad 14 and the wires 7b at the both ends of the second wiring layer 7 can be maintained. The dimensions of the opening section 9 may be designed to be greater than 0.5 μm×0.5 μm. The dimensions and number of the opening section 9 may be determined considering a current flowing through the bonding pad 14 and other factors.

The polyimide film 10 is a shock-absorbing film to prevent a break in the second wiring layer 7, relieving stress such as pressure caused by bonding when the semiconductor integrated circuit where the bonding pad 14 is formed is bonded to an external substrate, etc. The thickness of the polyimide film 10 may be satisfactorily specified as long as it is enough to reduce the stress applied to the second wiring layer 7, but is desirably within a range of 2 μm to 5 μm.

The type of the polyimide film 10 is not particularly limited, but it is especially preferable to use a condensed polyimide film formed by the dehydration condensation (thermo-setting or photo-setting) of a polyamic acid solution.

The opening section 11 in the polyimide film 10 may be adequately provided as long as it is provided at a position including the region overlying the opening section 9 in the protection film 8. The cross-sectional area of the opening section 11 at the end on the side of the protection film 8 (the area of the cross section along a face parallel to the silicon substrate 1) is determined to be greater than the cross-sectional area of the opening section 9 in the protection film 8 at the end on the side of the polyimide film 10 (the area of the cross section along a face parallel to the silicon substrate 1). However, the cross-sectional area of the opening section 11 in the polyimide film 10 at the end on the side of the protection film 8 is determined much smaller than the cross-sectional area of the bonding pad 14 formed on the polyimide film 10, which is along a face parallel to the silicon substrate 1. In the present embodiment, the polyimide film 10 should be provided in the regions overlying the wires 7b at the both ends of the second wiring layer 7 so as to relieve an impact applied from the side of the bonding pad 14 to the wires 7b at the both ends of the second wiring layer 7. Therefore, the cross section of the opening section 11 at the end on the side of the protection film 8 is determined to have the dimensions about 10 μm×10 μm.

The bonding pad 14 is an electrode for external connection, connecting the wire 7a of the second wiring layer 7 to an external semiconductor device by wire bonding, etc. The bonding pad 14 is formed at least at the position overlying the opening section 9 in the protection film 8 (just above the opening section 9 in the protection film 8). The bonding pad 14 is composed of a gold bump (gold layer) 13 and a barrier metal (high melting point metal layer) 12. The barrier metal 12 is provided so as to block the reaction between gold constituting the gold bump 13 and a material constituting the wire 7a, formed in a section where the barrier metal 12 is joined to the wire 7a in the middle of the second wiring layer 7. The gold bump 13 is exposed to the surface so as to connect the wire 7a of the second wiring layer 7 to an external section, and is formed in a region overlying the second wiring layer 7. The gold bump 13 is joined to the wire 7a via the barrier metal 12, and it is not directly joined to the wire 7a.

The barrier metal 12 is a metal film having a high melting point, which blocks the reaction between a main metal constituting the bonding pad 14, that is, in the present embodiment, gold constituting the gold bump 13 and a conductive material constituting the second wiring layer 7 such as aluminum. Besides, the barrier metal 12 can adhere to the polyimide film 10 more closely than gold. Therefore, the barrier metal 12 can improve the adhesiveness between the bonding pad 14 and the polyimide film 10, compared with the case where the gold bump 13 is directly joined to the wire 7a in the middle of the second wiring layer 7. The barrier metal 12 may be sufficiently provided as long as it is made of a high melting point metal, desirably having low reactivity and low resistance value, and it is more preferable that it is made of titanium (Ti) or a titanic compound (for example, a nitride). Besides, the barrier metal 12 may have a two-layer structure.

Incidentally, the gold bump 13 is formed so that its cross section along a face parallel to the silicon substrate 1 is sufficiently greater than the cross section of the opening section 11 in the polyimide film 10 at the end on the side of the gold bump 13 (the cross section along a face parallel to the silicon substrate 1).

Next, referring to FIGS. 2 to 7, the following description will describe a method for manufacturing the foregoing semiconductor integrated circuit. FIGS. 2 to 7 are schematic cross-sectional views showing processes for manufacturing the semiconductor integrated circuit.

First, on a part of the surface of the silicon substrate 1 as a semiconductor substrate, the insulation films 24 for element isolation are formed in the element isolation regions of the silicon substrate 1, and the semiconductor element 20 as a MOS transistor is formed, according to the procedure generally used when manufacturing semiconductor integrated circuits.

Next, to cover the active region of the silicon substrate 1, the insulation film 25 is deposited by a predetermined thickness by means of the CVD method, all over a single surface of the substrate including the silicon substrate 1. Here, the wording "all over a single surface of the substrate including the silicon substrate 1" means all over a single surface of substances including the silicon substrate 1 and the components formed on the silicon substrate.

Next, contact holes are opened in the insulation film 25 at predetermined positions to obtain the insulation film 25 having the contact holes. To open contact holes in the insulation film 25, the photolithography process and the insulation film etching process are used. These processes are also carried out in a condition generally used in a process for manufacturing semiconductor integrated circuits. Since the processes so far are general processes not limited to the present invention, the description of the schematic cross-sectional views will be omitted.

Next, all over the single surface of the substrate including the silicon substrate 1, a conductive film for forming the first wiring layer 2 (hereinafter referred to as a first conductive film) is deposited. That is, the first conductive film is deposited on the insulation film 25 and in the contact holes in the insulation film 25.

The first conductive film may be a single-layer metal film, or may be a laminated film having a plurality of metal films. Further, the first conductive film may be a laminated film including a semiconductor film with low resistivity and a metal film. In the present embodiment, a laminated film composed of a TiW film with a thickness of 310 nm and an AlSi film with a thickness of 600 nm, which are laminated so that the TiW film is provided on the side of the silicon substrate 1, is adopted as the first conductive film.

Figure 2:
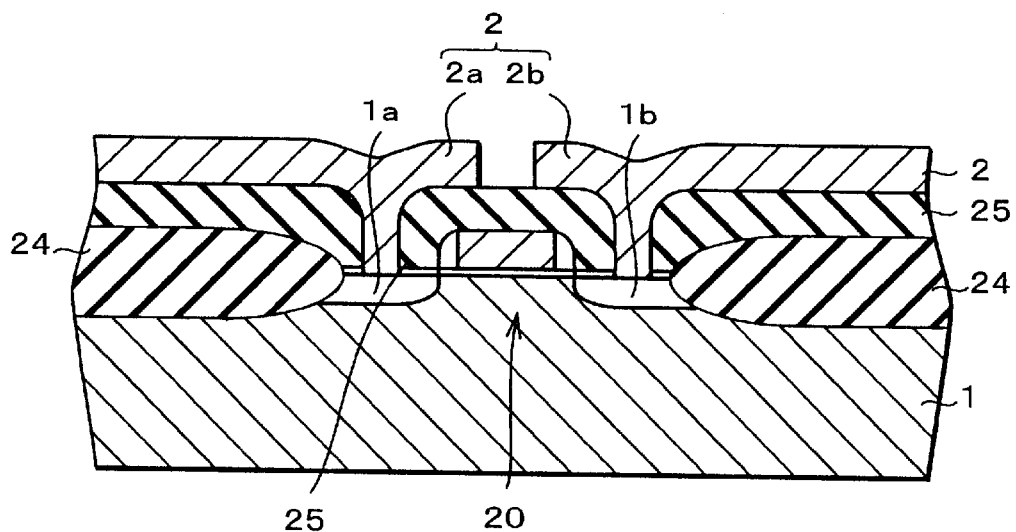
FIG. 2 is a schematic cross-sectional view explaining a process for manufacturing the semiconductor integrated circuit, showing the state when a process for forming a first wiring layer is completed.

Next, as shown in FIG. 2, the first conductive film is processed in a predetermined shape to form the first wiring layer 2 including a plurality of wires 2a and 2b. By the first wiring layer 2, the semiconductor element 20 is connected to an external section, that is, the wiring is provided between the source region (the impurity diffusion layer 1a) and the drain region (the impurity diffusion layer 1b) of the silicon substrate 1, and another semiconductor element which is not shown.

Figure 3:
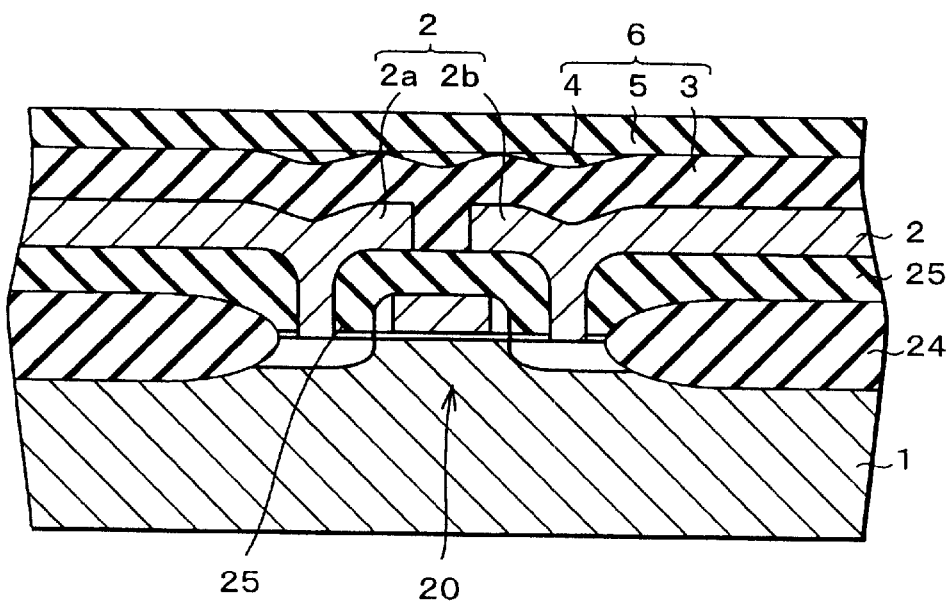
FIG. 3 is a schematic cross-sectional view explaining the foregoing manufacturing process, showing the state when a process for forming an inter-layer insulation film is completed.

Next, the inter-layer insulation film 6 is formed all over the single surface of the substrate including the silicon substrate 1. In the manufacturing method of the present embodiment, as shown in FIG. 3, to form the insulation film 6, first, the silicon oxide film ($SiO_2$ film) 3 with a thickness of 500 nm is formed on the first wiring layer 2 by the plasma CVD method, then the SOG film 4 is formed and etched back so as to be left only at the concave portions of the silicon oxide film 3, and the silicon oxide film 5 with a thickness of 450 nm is further deposited over by the CVD method. Here, there are some cases where the process for forming and etching back the SOG film 4 and the following process for depositing the silicon oxide film 5 by the CVD method are carried out repeatedly as necessary, but detailed description will be omitted.

Figure 4:
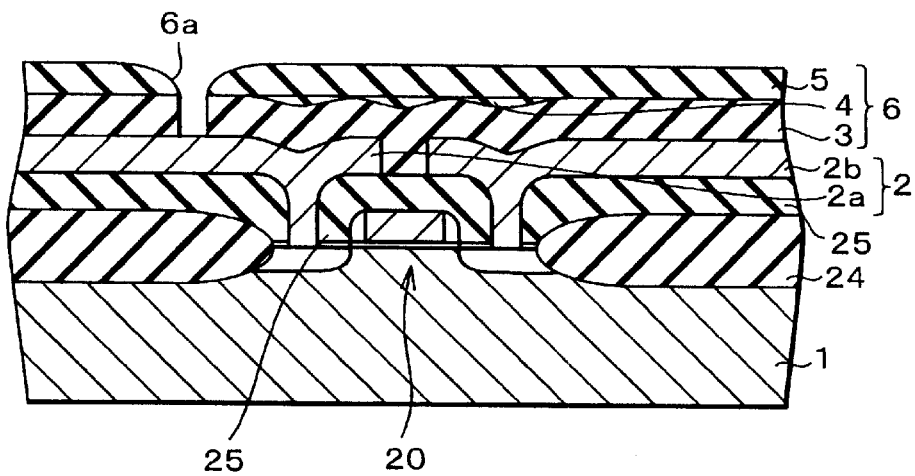
FIG. 4 is a schematic cross-sectional view explaining the foregoing manufacturing process, showing the state when a process for forming an opening section in the inter-layer insulation film is completed.

Next, as shown in FIG. 4, a via hole 6a is opened at a predetermined position in the inter-layer insulation film 6. The via hole 6a is an opening section for connecting the wire 2a of the first wiring layer 2 with the wire 7b of the second siring layer 7.

The process for forming the via hole 6a is referred to as a hole opening process (or a via hole forming process). In this hole opening process, a normally used photolithography process and a normally used insulation film etching process are used. However, when a stepped section of the inter-layer insulation film 6 where a hole is opened (an inner wall of the section where the via hole 6a is formed) is not inclined with respect to the upper surface of the inter-layer insulation film 6, there is a possibility that the wires 7a and 7b of the second wiring layer 7, formed on the inter-layer insulation film 6 with a conductive film, might have a break at the stepped section. Thus, in the present embodiment, to avoid such a break in the wires 7a and 7b of the second wiring layer 7, the stepped section is inclined by combining a plurality of etching conditions. Specifically, as a first step, isotropic etching is carried out on the inter-layer insulation film 6 so as to form a concave section with its inner wall inclined at a predetermined angle, at a position for the stepped section (the position to be the via hole 6a), then aelotropic etching is carried out on the inter-layer insulation film 6 so as to open the via hole 6a at the position of the foregoing concave section.

Figure 5:
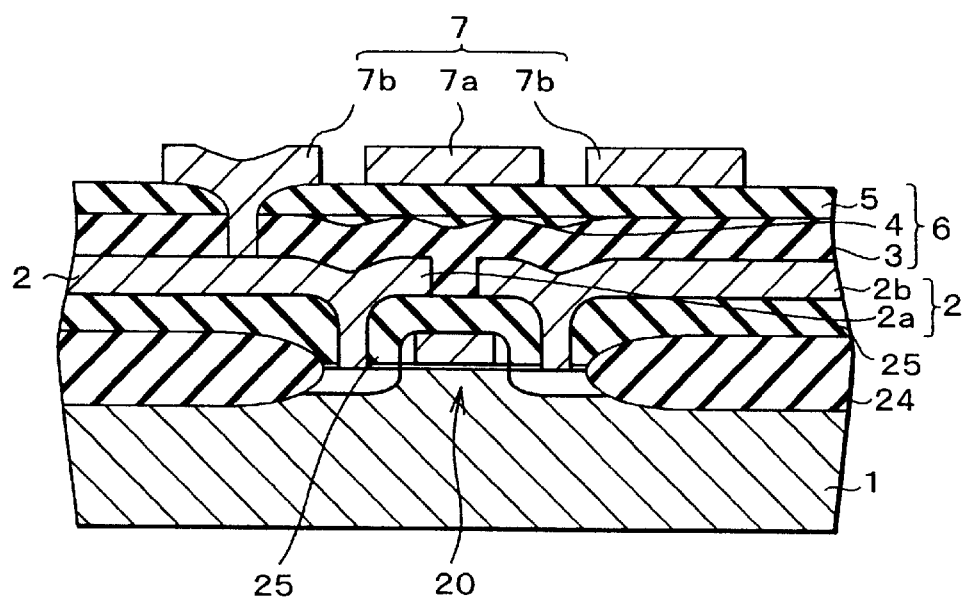
FIG. 5 is a schematic cross-sectional view explaining the foregoing manufacturing process, showing the state when a process for forming a second wiring layer is completed.

Next, a conductive film for forming the second wiring layer 7 (hereinafter referred to as a second conductive film) is deposited on the inter-layer insulation film 6 and in the via hole 6a. Then, patterning is provided on the second conductive film so that it has a predetermined wiring pattern, and thus the second wiring layer 7 is formed as shown in FIG. 5. In the present embodiment, a laminated film composed of a TiW film with a thickness of 150 nm and an AlSi film with a thickness of 1,100 nm, which are laminated so that the TiW film is provided on the side of the silicon substrate 1, is adopted as the second conductive film.

Figure 6:
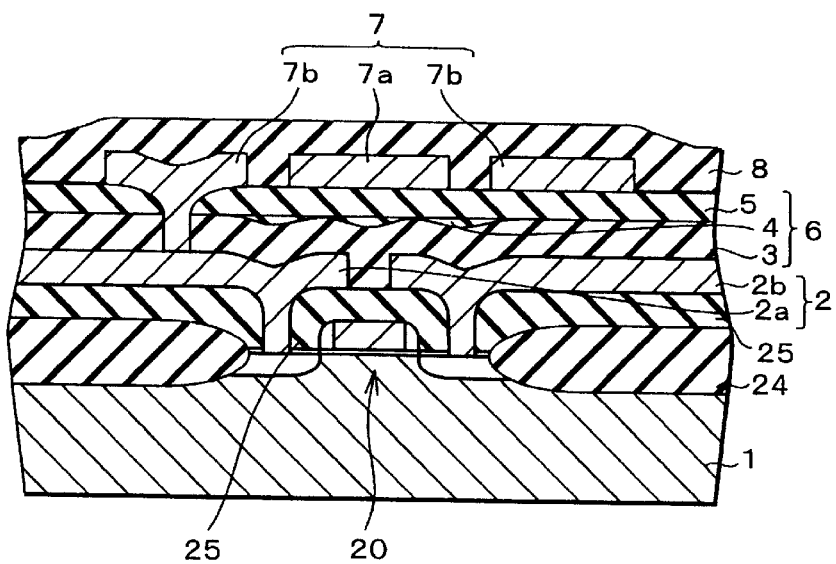
FIG. 6 is a schematic cross-sectional view explaining the foregoing manufacturing process, showing the state when a process for forming a protection film is completed.

Next, as shown in FIG. 6, the protection film 8 is formed so as to cover the second wiring layer 7. In the present embodiment, a laminated film composed of a silicon oxide film (SiO$_2$ film) with a thickness of 400 nm formed by the plasma CVD method and a silicon nitride film (SiN film) with a thickness of 720 nm formed by the plasma CVD method, which are laminated so that the silicon oxide film is provided on the side of the silicon substrate 1, is adopted as the protection film 8. Then, the opening section 9 is formed at a predetermined position in the protection film 8. Here, the opening section 9 is formed so as to expose only the wire 7a among the plurality of the wires 7a and 7b of the second wiring layer 7 covered by the protection film 8.

Figure 7:
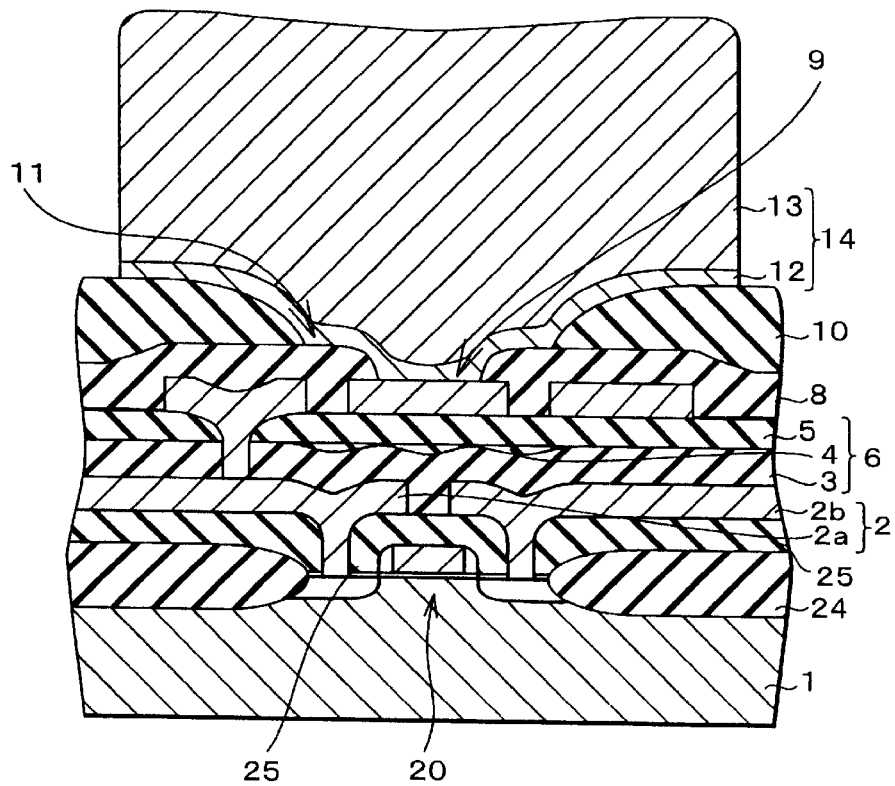
FIG. 7 is a schematic cross-sectional view explaining the foregoing manufacturing process, showing an completed semiconductor device.
Figure 8:
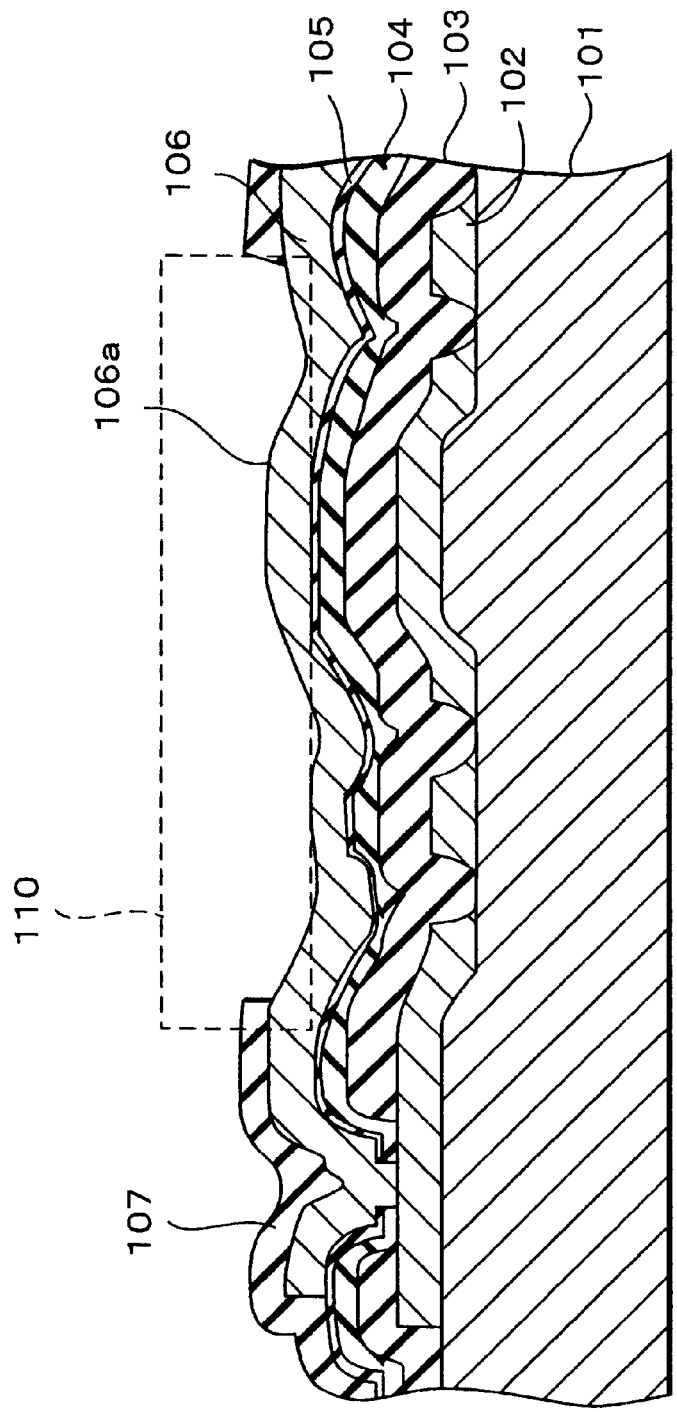
FIG. 8 is a schematic cross-sectional view showing an example of a conventional semiconductor device.
Figure 9:
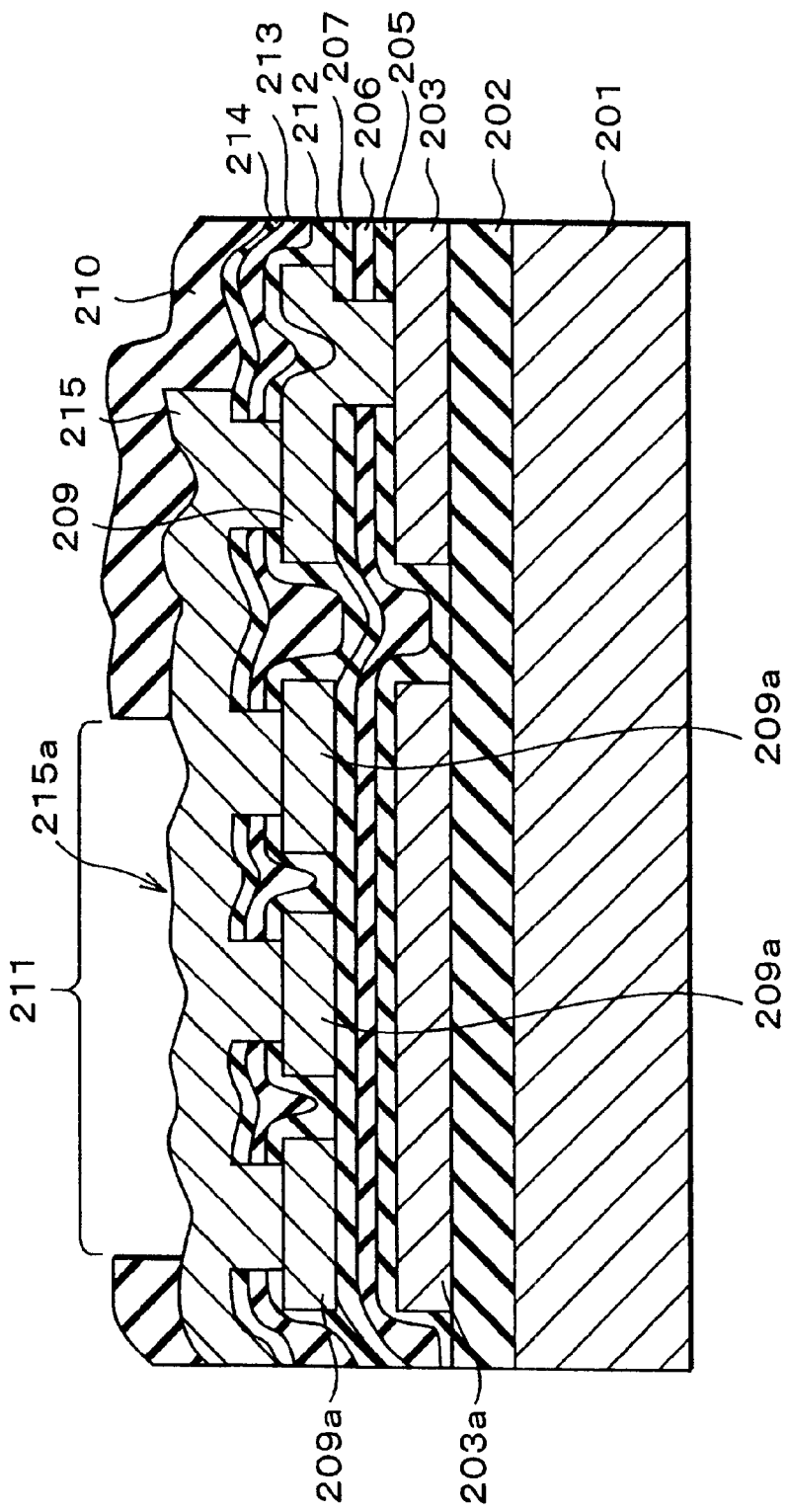
FIG. 9 is a schematic cross-sectional view showing another example of a conventional semiconductor device.
Figure 10:
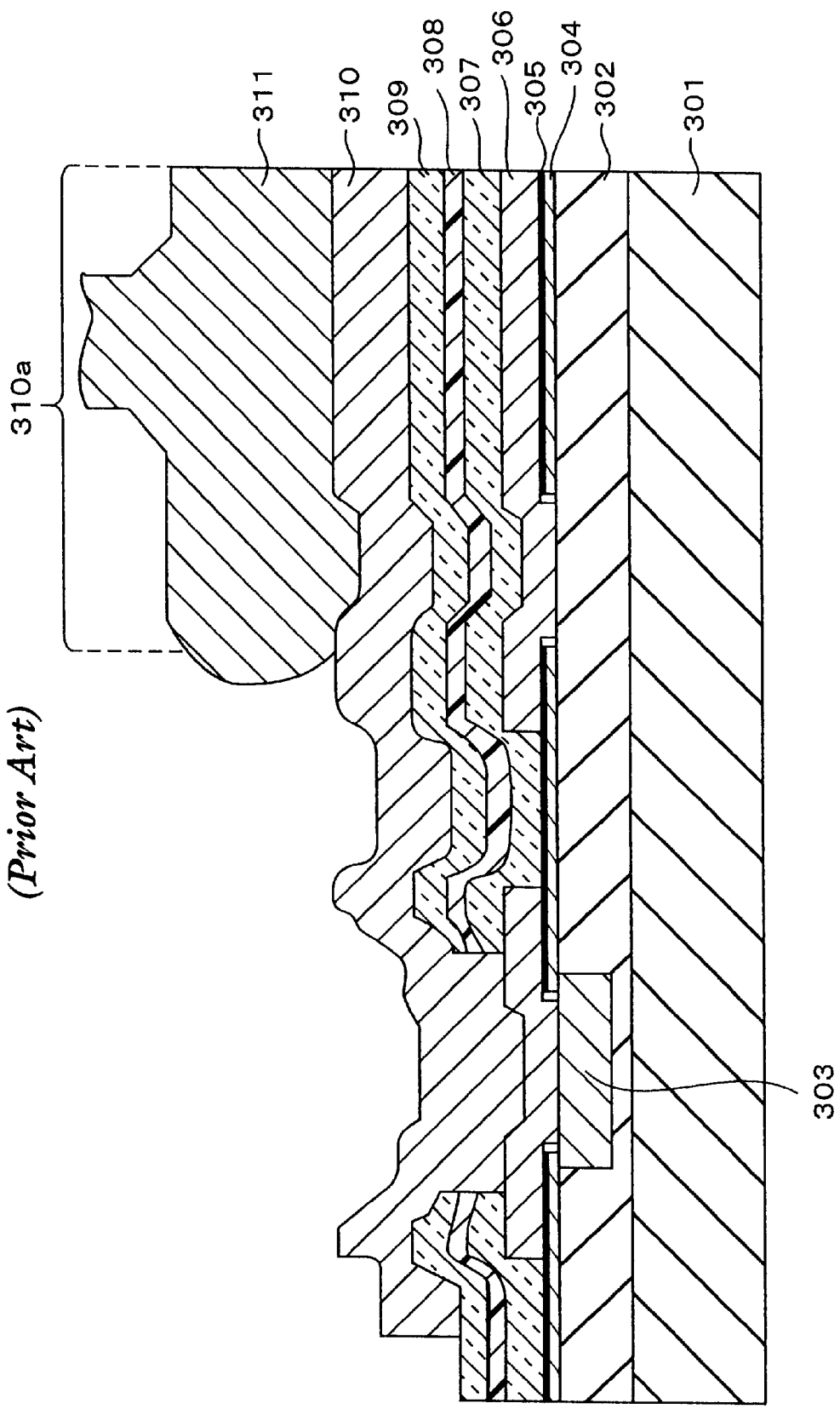
FIG. 10 is a schematic cross-sectional view showing still another example of a conventional semiconductor device.
Figure 11B:
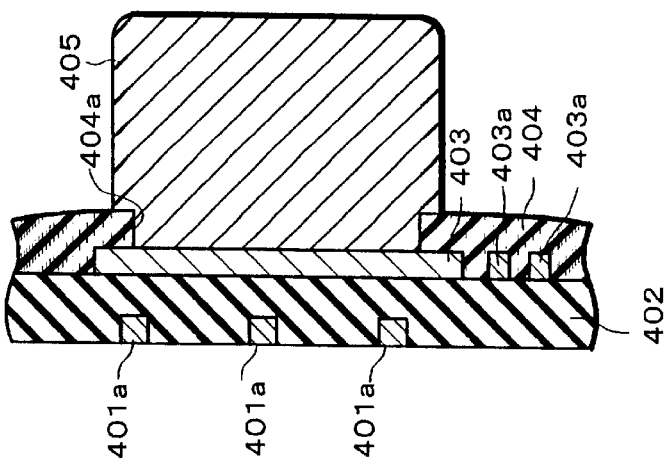
FIG. 11B is a cross-sectional view taken along a line X–X' in the semiconductor device in FIG. 11A.
Figure 11A:
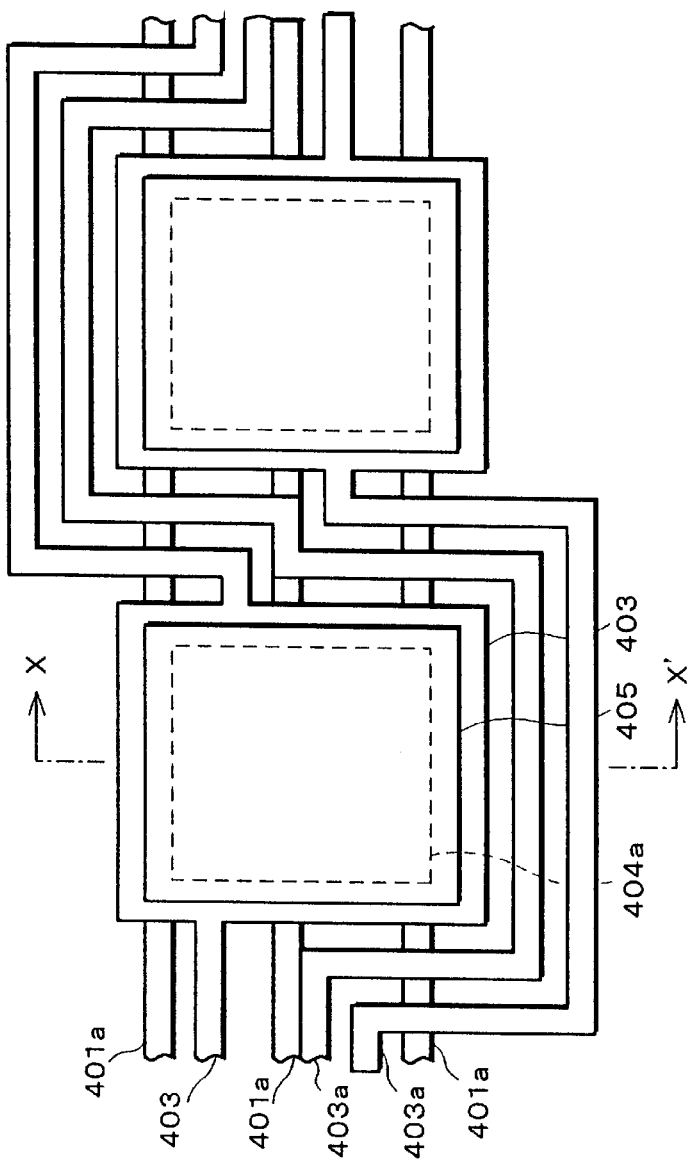
FIG. 11A is a schematic cross-sectional view showing still another example of a conventional semiconductor device, schematically showing the state of wiring in the semiconductor device.

Next, the polyimide film 10 is formed. In the present embodiment, it is formed by coating the polyimide film 10 with a thickness of 4 μm. Then, the opening section 11 is formed at a predetermined position in the polyimide film 10. The opening section 11 is also formed so as to expose only the wire 7a among the plurality of the wires 7a and 7b of the second wiring layer 7 covered by the protection film 8. Also in this case, a stepped section of the polyimide film 10 (an inner wall of the section where the opening section 11 is formed) is inclined, by adding the isotropic etching condition. Thus, as shown in FIG. 7, the cross-sectional shape at the opening section 11 in the polyimide film 10 is formed in a so-called "bird's beak" shape.

Next, the bonding pad 14, composed of the barrier metal 12 and the gold bump 13, is formed so as to cover the opening section 9 in the protection film 8, and so that at least a part of the bonding pad 14 overlies the active region of the silicon substrate 1, and also overlies the plurality of the wires 7a and 7b of the second wiring layer 7 covered by the protection film 8.

Specifically, first, the barrier metal 12 and a thin gold film are deposited. In the present embodiment, a thin TiW film with a thickness of 250 nm is deposited as the barrier metal 12, then a thin gold film with a thickness of 170 nm is deposited. In the method for manufacturing a semiconductor integrated circuit of the present embodiment, the barrier metal 12 also serves as an electrode when forming the bonding pad 14 by the plating method.

Next, using the barrier metal 12 as an electrode, the gold bump 13 with a predetermined thickness is formed at a predetermined position. In the present embodiment, the thin TiW film and the thin gold film as the barrier metal 12 are used as an electrode to plate gold with a thickness of about 10 μm on the gold thin film, forming the gold bump 13 whose size (the area of the cross section along a face parallel to the silicon substrate 1) is about 35 μm×50 μm. Then, an unnecessary part of the barrier metal 12 is removed, using the gold bump 13 as a mask, which results in the completion of the semiconductor integrated circuit of the present embodiment as shown in FIG. 7.

As has been described, in the semiconductor integrated circuit of the present embodiment, the plurality of the wires 7a and 7b of the second wiring layer 7 are also placed in the region underlying the bonding pad 14, and while the bonding pad 14 is joined to the wire 7a, the other wires 7b are insulated from the bonding pad 14 by the protection film 8 and the polyimide film 10. Since the other wires 7b and the bonding pad 14 are insulated in such a manner, there is no need to bypass the wiring between adjacent semiconductor elements (the wires 7b) so as to avoid the region underlying the bonding pad 14. That is, the wires 7b can be placed in the region underlying the bonding pad 14. Therefore, the area of the region required for the wiring can be reduced. As a result, in the example of the present embodiment, around 10 percent reduction in chip size (the size of a semiconductor device) can be achieved, although it varies according to the integration level and the functions of a semiconductor integrated circuit.

In a conventional semiconductor device where a part of a wiring layer is used as a bonding pad, there is a problem that, for example, as shown in FIG. 11, a plurality of wires of the second wiring layer cannot be placed in a region underlying the bonding pad, or as shown in FIG. 12, a plurality of wires of the second wiring layer can be placed in the region underlying the bonding pad but it requires a complicated manufacturing process.

That is, in a conventional semiconductor device with a two-layer wiring structure where a part of a wiring layer is used as a bonding pad, as the one disclosed in Japanese Unexamined Patent Publication No. 5-251573/1993 or the one shown in FIG. 11, a plurality of wires of the second wiring layer cannot be placed in a region underlying the bonding pad.

If the semiconductor device using a part of a wiring layer as a bonding pad has a three-layer wiring structure as shown in FIG. 12, it becomes possible to place a plurality of wires of the second wiring layer in a region underlying the bonding pad. However, in this case, a third wiring layer and a second inter-layer insulation film for insulating the third wiring layer from the second wiring layer should be added to the semiconductor device with a two-layer wiring structure shown in FIG. 11. Therefore, when placing a plurality of wires of the second wiring layer in the region underlying the bonding pad, a process for depositing and processing the second inter-layer insulation film (by photolithography and etching) and a process for depositing and processing the third metal layer should be added to the process for manufacturing the semiconductor device disclosed in Japanese Unexamined Patent Publication No. 5-251573/1993 or shown in FIG. 11.

On the contrary, in the semiconductor integrated circuit of the present embodiment, the bonding pad 14 is directly joined to the wire 7a in the middle of the second wiring layer 7, without a third wiring layer in between, which eliminates the need for a second inter-layer insulation film for insulating the second wiring layer from the third wiring layer. Therefore, the processes for depositing and processing these layers are not required, and thus the manufacturing process can be shortened.

As described in the section of the background of the invention, an example using a polyimide film as a shock absorbing material is also disclosed in Japanese Unexamined Patent Publication No. 5-251573/1993. However, in the example in the foregoing publication, a part of the second wiring layer is used as a bonding pad. Thus, while an impact applied to the first wiring layer can be absorbed by the polyimide film, an impact applied to the second wiring layer cannot be absorbed by the polyimide film. Therefore, there is a possibility that a problem such as a break might be caused due to an impact applied during bonding.

On the contrary, in the present embodiment, since the polyimide film 10 is provided between the bonding pad 14 and the wires 7b at the both ends of the second wiring layer 7, the polyimide film 10 can absorb an impact applied to the wires 7b of the second wiring layer 7 which are placed in the region underlying the bonding pad 14. As a result, a problem such as a break, caused by the impact applied during bonding, can be prevented.

Further, in the present embodiment, the polyimide film 10 as an organic polymeric film has the opening section 11 for joining the wire 7a of the second wiring layer 7 to the bonding pad 14, and the polyimide film 10 in a section surrounding the opening section 11 is formed in such a manner that the shape of its cross section looks like a so-called "bird's beak". That is, the polyimide film 10 in the section surrounding the opening section 11 is formed such that its inner wall is inclined to be spread outward (with respect to the normal on the surface of the silicon oxide film 5) as it approaches the bonding pad 14, and the inclination angle of the inner wall with respect to the surface of the silicon oxide film 5 serving as a base becomes gentler as the wall approaches the bonding pad 14. In other words, the diameter of the opening section 11 in the polyimide film 10 increases with distance from the semiconductor substrate. Besides, the interface between the bonding pad 14 and the polyimide film 10 surrounding the opening section 11 is formed as an arc projecting toward the bonding pad 14.

When the inner wall of the polyimide film 10 surrounding the opening section 11 is not inclined and the polyimide film 10 is not formed to have a cross section in a "bird's beak" shape, that is, when the opening section 11 is formed such that the inner wall of the polyimide film 10 is perpendicular to the surface of the silicon oxide film 5, the following problems might be caused.

First, since both of the opening section 11 in the polyimide film 10 and the opening section 9 in the protection film 8 are holes having minute diameters, there is a possibility that the barrier metal 12 formed in the surroundings of the opening section 11 in the polyimide film 10 might have a break in its forming process. If the barrier metal 12 has a break, when forming the gold bump 13 in the next process, gold of the gold bump 13 and a conductive material such as aluminum which constitutes the wire 7a of the second wiring layer 7 come into contact each other and react, causing a defect such that the wiring resistance of the second wiring layer 7 becomes nonuniform.

Secondly, there is a possibility that connection failure might occur at the time of mounting. The bonding pad 14 is formed in a shape reflecting the shape of its base, that is, the shape of the opening section 11 in the polyimide film 10 and the opening section 9 in the protection film 8. Thus, when the inner wall of the polyimide film 10 surrounding the opening section 11 is not inclined and is perpendicular to the surface of the silicon oxide film 5, the bonding pad 14 is formed so as to have a right-angle step.

To solve such problems, in the present embodiment, the stepped section of the polyimide film 10 (the inner wall of the section where the opening section 11 is formed) is inclined (with respect to the normal of a wafer surface), forming the cross section of the polyimide film 10 like in a "bird's beak" shape.

This structure can reduce the possibility that the barrier metal 12 has a break at the opening section 11, preventing the contact between the gold bump 13 and the wire 7a of the second wiring layer 7. Consequently, this structure can provide an uniform wiring resistance of the second wiring layer 7. Besides, since the step on the surface of the bonding pad 14 is sloped, connection failure at the time of mounting can be prevented.

The inclination angle of the inner wall of the polyimide film 10 with respect to the surface of the silicon oxide film 5 does not always have to become gentler as the inner wall approaches the bonding pad 14, and it may be a certain angle. However, the structure in which the inclination angle becomes gentler as the inner wall approaches the bonding pad 14 is preferable since the step on the surface of the bonding pad 14 can be sloped more gently, surely preventing the connection failure at the time of mounting.

To form the polyimide film 10 so as to have a cross section in such a "bird's beak" shape, for example, the polyimide film 10 made of a non-photosensitive condensed polyimide resin (non-photosensitive polyimide) is formed all over a wafer, then a portion of the polyimide film 10 where the opening section 11 is to be formed is removed by isotropic etching. Thus, the cross section of the polyimide film 10 can be formed in a "bird's beak" shape.

Besides, it is desirable in the present embodiment to incline not only the inner wall of the polyimide film 10, but also the inner wall of the protection film 8 surrounding the opening section 9, as shown in FIG. 7. This structure can prevent the barrier metal 12 from having a break at a section in the opening section 9. Therefore, this structure can further surely prevent the connection between the gold bump 13 and the wire 7a of the second wiring layer 7, resulting in improving the uniformity of the wiring resistance of the second wiring layer 7.

Second Embodiment

Referring to FIGS. 13A, 13B, 14, and 15, the following description will describe another embodiment of the present invention. The members having the same structure (function) as those in the above-mentioned embodiment will be designated by the same reference numerals and their description will be omitted.

In the first embodiment, there is a possibility that the following problem might be caused in some cases.

The semiconductor integrated circuit of the first embodiment is generally mounted in a tape carrier package (hereinafter referred to as a TCP) in which a wiring pattern, which is made of a conductive material such as copper and which has inner leads and outer leads, is formed on an insulation film (substrate). Mounting of the semiconductor integrated circuit requires processing to press an inner lead of the TCP to (the gold bump 13 of) the bonding pad 14 in the semiconductor integrated circuit under a certain pressure, and to connect the inner lead to the (gold bump 13 of) the bonding pad 14 (hereinafter, the processing will be referred to as inner lead bonding).

When carrying out inner lead bonding, since the inner lead of the TCP is pressed to the bonding pad 14 in the semiconductor integrated circuit under a certain pressure, the inner lead of the TCP and the insulation film are warped. After inner lead bonding is completed, the warped inner lead and insulation film try to return to the original state. However, since the inner lead and the bonding pad 14 are already connected at this point in time, the restoring force of the inner lead and the bonding pad 14 serves as a force acting in the direction to pull off the bonding pad 14. This force causes a force which is applied to an interface between the polyimide film 10 and the protection film 8 in the region underlying the bonding pad 14, and acts in the direction to pull off the polyimide film 10 from the protection film 8, which might result in a delamination between the polyimide film 10 the protection film 8.

Here, if no deviation occurs in the connection between the inner lead and the bonding pad 14, the adhesion force between the protection film 8 and polyimide film 10 is greater than the force for pulling off the bonding pad 14, so such a delamination phenomenon is difficult to be caused. However, while the registration accuracy of the inner lead is around ±12.5 μm, the size of the opening section 9 is smaller, 5 μm×5 μm. Thus, when a relatively large deviation occurs in the connection between the inner lead and the bonding pad 14 within a range of the registration accuracy of the inner lead during inner lead bonding, stress is concentrated onto an the insulation film made of the polyimide film 10 and the protection film 8 just below the bonding pad 14 which is connected to the inner lead, and the force acting in the direction of pulling off the bonding pad 14 becomes greater than the adhesion force acting at the interface between the protection film 8 and the polyimide film 10. As a result, the delamination phenomenon is prone to be caused at the interface between the protection film 8 and the polyimide film 10.

In the case of the first embodiment, the protection film 8 and the polyimide film 10 contact each other at a virtually planar interface, which means that the contact area between the protection film 8 and the polyimide film 10 is small, and thus the adhesiveness between the protection film 8 and the polyimide film 10 might become insufficient in some cases, which might result in the occurrence of the delamination phenomenon.

To avoid the foregoing delamination phenomenon, the present embodiment has an object to improve the adhesiveness between the protection film 8 and the polyimide film 10 (an organic polymeric film).

Figure 13A:
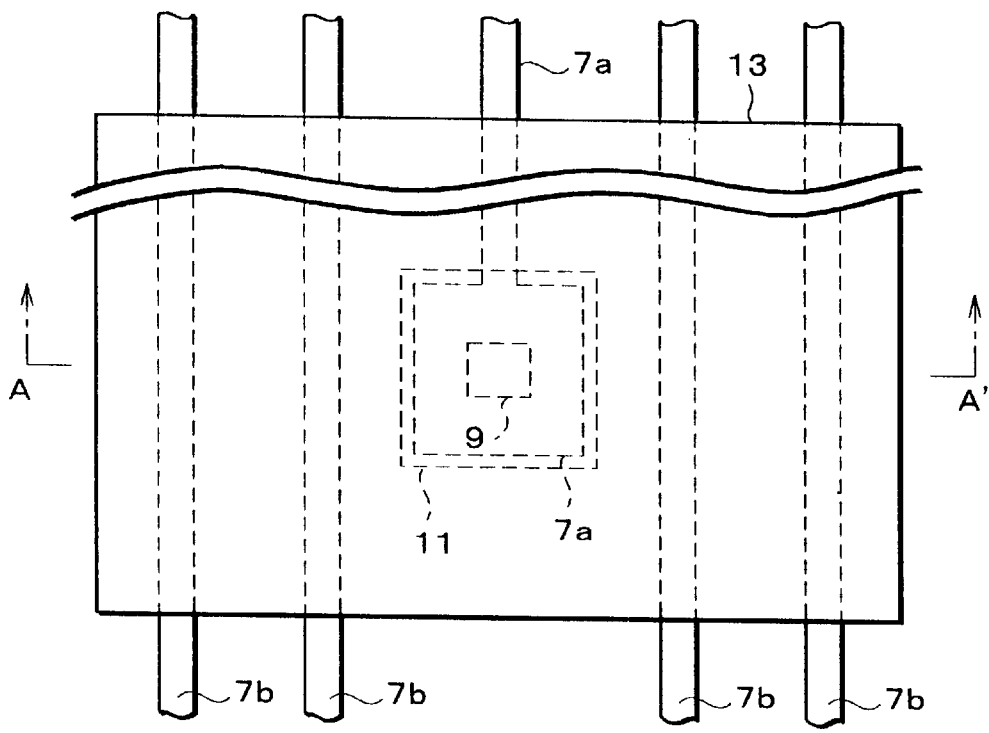
FIG. 13A is a plan view showing a schematic structure of a semiconductor integrated circuit as a semiconductor device in accordance with another embodiment of the present invention, schematically showing the state of wiring in the semiconductor device.
Figure 13B:
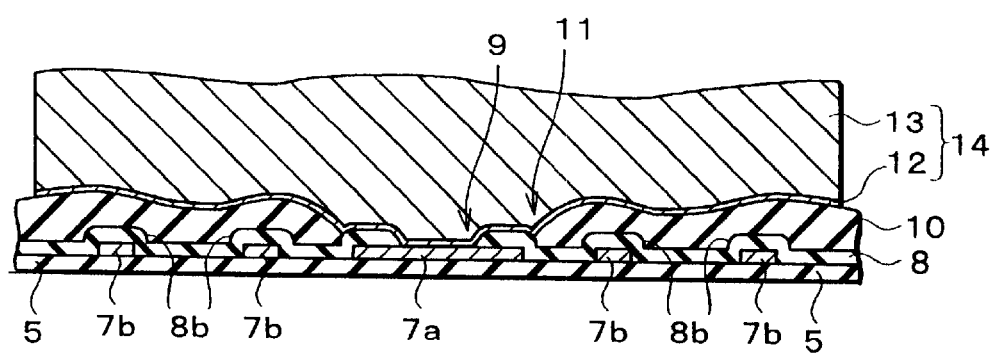
FIG. 13B is a cross-sectional view taken along a line A–A' in the semiconductor device shown in FIG. 13A.

To achieve the foregoing object, a semiconductor integrated circuit (semiconductor device) of the present embodiment is arranged as shown in FIG. 13B, such that, in a structure in which an insulation film between the second wiring layer 7 and the bonding pad 14 includes the protection film 8 and the polyimide film 10, a convex section 8b is formed on the surface of the protection film 8 on the side of the polyimide film 10, at a position corresponding to the position of the wire 7b (the wire except the wire 7a) of the second wiring layer 7, which is insulated from the bonding pad 14. In the foregoing structure, a plurality of wires 7b are provided on each side of the wore 7a of the second wiring layer 7, which is joined to the bonding pad 14 in the region underlying the bonding pad 14 (in the example shown in FIGS. 13A and 13B, two wires 7b are provided for each side of the wire 7a).

In the structure of the present embodiment, since a plurality of wires 7b are provided on each side of the wire 7a joined to the bonding pad 14, the contact area between the protection film 8 and the polyimide film 10 becomes larger, and as a result, the adhesiveness between the protection film 8 and the polyimide film 10 is improved, which can prevent the delamination phenomenon from being caused between the protection film 8 and the polyimide film 10.

Further, it is desirable that the convex section 8b formed on the surface of the protection film 8 on the side of the polyimide film 10 is formed in an overhang shape (the upper section expands outward, compared with the bottom section), as shown in FIGS. 13A, 13B, and 14. Here, the wording "overhang shape" means a shape shown in FIG. 14, in which X>Y is satisfied, where X represents the maximum outer shape length of the convex section 8b along an arbitrary direction parallel to the substrate surface (the direction orthogonal to the wires 7a and 7b in the example shown in FIG. 14), and Y represents the length of the lowest part of the convex section 8b along the direction. With this structure, the polyimide film 10 is also deposited at a constricted section 8a (see FIG. 14) of the convex section 8b formed in the overhang shape, and the convex section 8b of the protection film 8 and the polyimide film 10 deposited at the constricted section 8a closely engage each other, improving the adhesiveness between the protection film 8 and the polyimide film 10. It is more preferable that the foregoing lengths X and Y satisfy the following inequality:

$$0.05 \ \mu m \leq (X-Y)/2 \leq 0.2 \ \mu m$$

Incidentally, such a convex section in an overhang shape can be formed easily by using a plasma CVD device providing relatively low step coverage, which will be described later.

Referring to FIGS. 13A and 13B, the following description will describe the semiconductor integrated circuit of the present embodiment in detail. FIG. 13A is a plan view, and FIG. 13B is a cross-sectional view taken along a line A–A' in FIG. 13A. Here, since the structure and the forming process of the semiconductor integrated circuit of the present embodiment for the part below the second wiring layer 7 are the identical to those of the semiconductor integrated circuit shown in FIG. 1, the explanation on the identical part will be omitted, and only the part different from the first embodiment will be explained. Besides, in FIGS. 13A and 13B, the SOG film 4 and the part below the SOG film 4 are omitted.

The semiconductor integrated circuit of the present embodiment is structured such that, as in the structure in the first embodiment, the second wiring layer 7 includes a plurality of the wires 7a and 7b in the region underlying the bonding pad 14, and a part of the wires (the wire 7a) is joined to the bonding pad 14. Between the wires 7b and the bonding pad 14 are formed the insulation films 8 and 10. As in the structure in the first embodiment, the wires 7b of the second wiring layer 7, which are provided below the insulation films (the protection film 8 and the polyimide film 10), are provided in the region underlying the bonding pad 14, and placed on the both sides of the wire 7a of the second wiring layer 7, which is joined to the bonding pad 14. The difference from the structure of the first embodiment is that a plurality of the wire 7b, which are insulated from the bonding pad 14, are provided on each side of the wire 7a of the second wiring layer 7, which is joined to the bonding pad 14.

As shown in FIGS. 13A and 13B, the protection film 8 and the polyimide film 10 are formed between the wires 7b of the second wiring layer 7 and the bonding pad 14. The opening sections 9 and 11 are provided in the protection film 8 and the polyimide film 10, respectively. Via the opening sections 9 and 11, the wire 7a of the second wiring layer 7 and the bonding pad 14 are joined. The wires 7b of the second wiring layer 7 are provided in the region underlying the bonding pad 14, and below the insulation films made up of the protection film 8 and the polyimide film 10. The wires 7b of the second wiring layer 7 are connected to other bonding pads or other semiconductor elements (device elements), which are not shown, respectively. Two wires 7b of the second wiring layer 7 are provided in parallel on the respective sides of the wire 7a of the second wiring layer 7, which is joined to the bonding pad 14.

The wire 7a of the second wiring layer 7, which is joined to the bonding pad 14, is located at a position underlying the center of the bonding pad 14. It is desirable that the wires 7b of the second wiring layer 7 are, for example, formed parallel and symmetrically provided at the identical wiring interval, with respect to the wire 7a of the second wiring layer 7. With this structure providing the wires 7b of the second wiring layer 7 symmetrically with respect to the bonding pad 14 (regarding the wire 7a of the second wiring layer 7 as a center), when a deviation is caused in the connection of an inner lead and the bonding pad 14 at the time of inner lead bonding, no matter which side (right side or left side) of the bonding pad 14 has the deviation, the occurrence of the delamination phenomenon at the interface between the protection film 8 and the polyimide film 10 can be prevented to the same extent.

The present embodiment shows an example where two wires 7b are formed on the respective sides of the wire 7a, at the same wiring interval on the both sides. However, the location of the wires 7b is not limited to this. It is satisfactory as long as, for example, at least two wires 7b insulated from the bonding pad 14 are provided on the respective sides of the wire 7a joined to the bonding pad 14. Therefore, it is not necessary to provide the same number of the wires 7b on the respective sides of the bonding pad 14 (the wire 7a), and the wires 7b may not be provided at the same wiring interval on the respective sides of the bonding pad 14.

Figure 15:
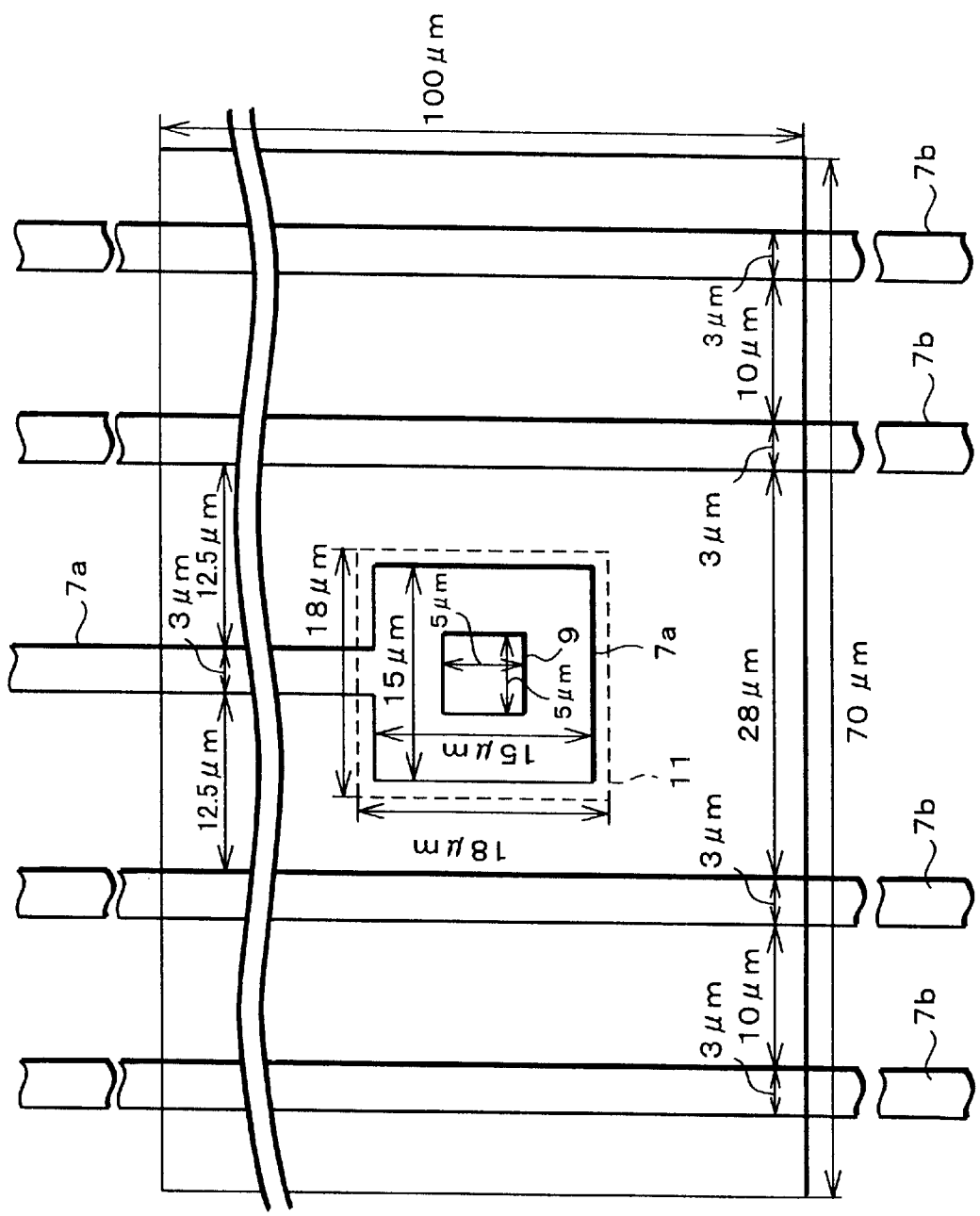
FIG. 15 is a plan view showing an example of design dimensions in the semiconductor integrated circuit in FIG. 13A.

Here, as shown in FIG. 15, it is determined that the bonding pad 14 has a width (the dimension in the direction orthogonal to the wires 7a and 7b) of 70 $\mu$m and a depth (the dimension in the direction parallel to the wires 7a and 7b) of 100 $\mu$m. The wire width of the wires 7a and 7b of the second wiring layer 7 is set at 3 $\mu$m. The wiring interval between the wires 7b of the second wiring layer 7 is set at 10 $\mu$m, and the wiring interval between the wire 7a and the wire 7b of the second wiring layer 7 is set at 12.5 $\mu$m.

As described, in the present embodiment, two wires 7b, insulated from the bonding pad 14, are formed on the respective sides of the wire 7a joined to the bonding pad 14, in the region underlying the bonding pad 14 (the region below the bonding pad 14). With this structure, even when a deviation occurs in the connection between the inner lead and the bonding pad 14 within a range of the registration accuracy of the inner lead during inner lead bonding, the delamination phenomenon is difficult to occur at the interface between the protection film 8 and the polyimide film 10. Further, in the present embodiment, the convex sections 8b in the overhang shape are formed on the protection film 8 at the positions corresponding to the positions of the wire 7b, further improving the adhesiveness at the interface between the protection film 8 and the polyimide film 10.

Next, the following description will describe processes from a process for forming the second wiring layer 7 to a process for forming the bonding pad 14.

A conductive film for forming the second wiring layer 7 made up of aluminum, etc. is deposited with a thickness of 1,250 nm on the inter-layer insulation film 6. Then, patterning is provided on the conductive film so that it has a predetermined wiring pattern, and thus the wires 7a and 7b of the second wiring layer 7 are formed simultaneously. Here, patterning is provided on the conductive film so that two wires 7b are formed on the respective sides of the wire 7a in the middle, which is joined to the bonding pad 14.

Next, the protection film 8 for protecting the second wiring layer 7 is formed so as to cover the wires 7a and 7b of the second wiring layer 7. In the present embodiment, a silicon oxide film with a thickness of 400 nm and a silicon nitride film with a thickness of 720 nm are formed respectively by the plasma CVD method in this order, and adopted as the protection film 8. When forming the silicon oxide film and the silicon nitride film, the convex section 8b of the protection film 8 can be easily formed in the overhang shape by using, for example, a plasma CVD device providing relatively low step coverage. Generally, step coverage means a ratio between the thicknesses of a film deposited at a lower part and at an upper part of a step on a substrate, and the value obtained by dividing the film thickness at the lower part of the step (the minimum thickness) by the film thickness at a flat part is expressed as a percentage.

Then, the opening section 9 with a size of 5 $\mu$m×5 $\mu$m is formed at a predetermined position in the protection film 8. Here, the opening section 9 is formed only at a position where the wire 7a of the second wiring layer 7 is joined to the bonding pad 14. Next, the polyimide film 10 with a thickness of 2,000 nm is formed by coating. Then, the opening section 11 is formed in the polyimide film 10 so as to surround the opening section 9.

Next, a TiW film with a thickness of 250 nm is deposited as the barrier metal 12, and gold with a thickness of 1,000 nm is deposited by the plating method. Then, the deposited gold is processed to form the gold bump 13 with a size of 70 $\mu$m×100 $\mu$m. Next, an unnecessary part of the barrier metal 12 is removed, using the gold bump 13 as a mask, to form the bonding pad 14 made up of the barrier metal 12 and the gold bump 13. Consequently, the semiconductor integrated circuit shown in FIGS. 13A and 13B is completed.

Third Embodiment

Figure 16A:
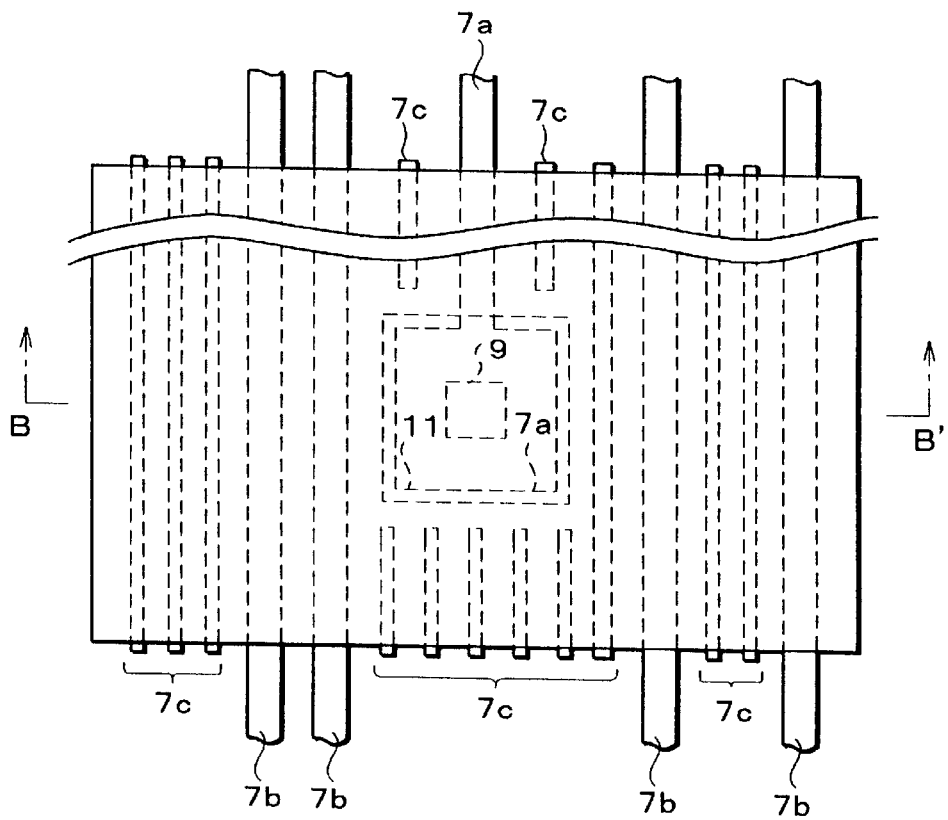
FIG. 16A is a plan view showing a schematic structure of a semiconductor integrated circuit as a semiconductor device in accordance with still another embodiment of the present invention, schematically showing the state of wiring in the semiconductor device.
Figure 16B:
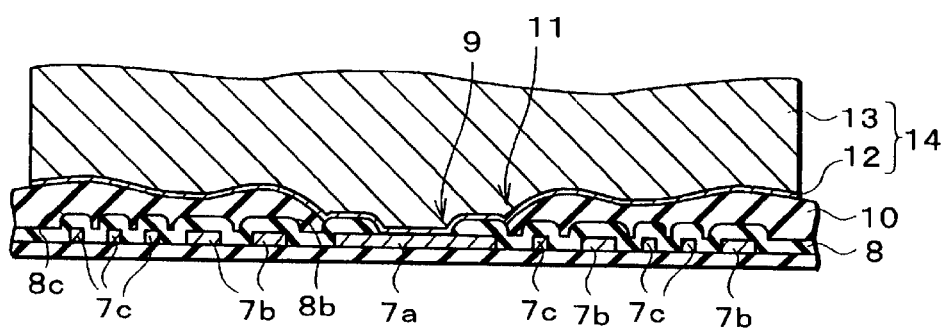
FIG. 16B is a cross-sectional view taken along a line B–B' in the semiconductor device shown in FIG. 16A.
Figure 17:
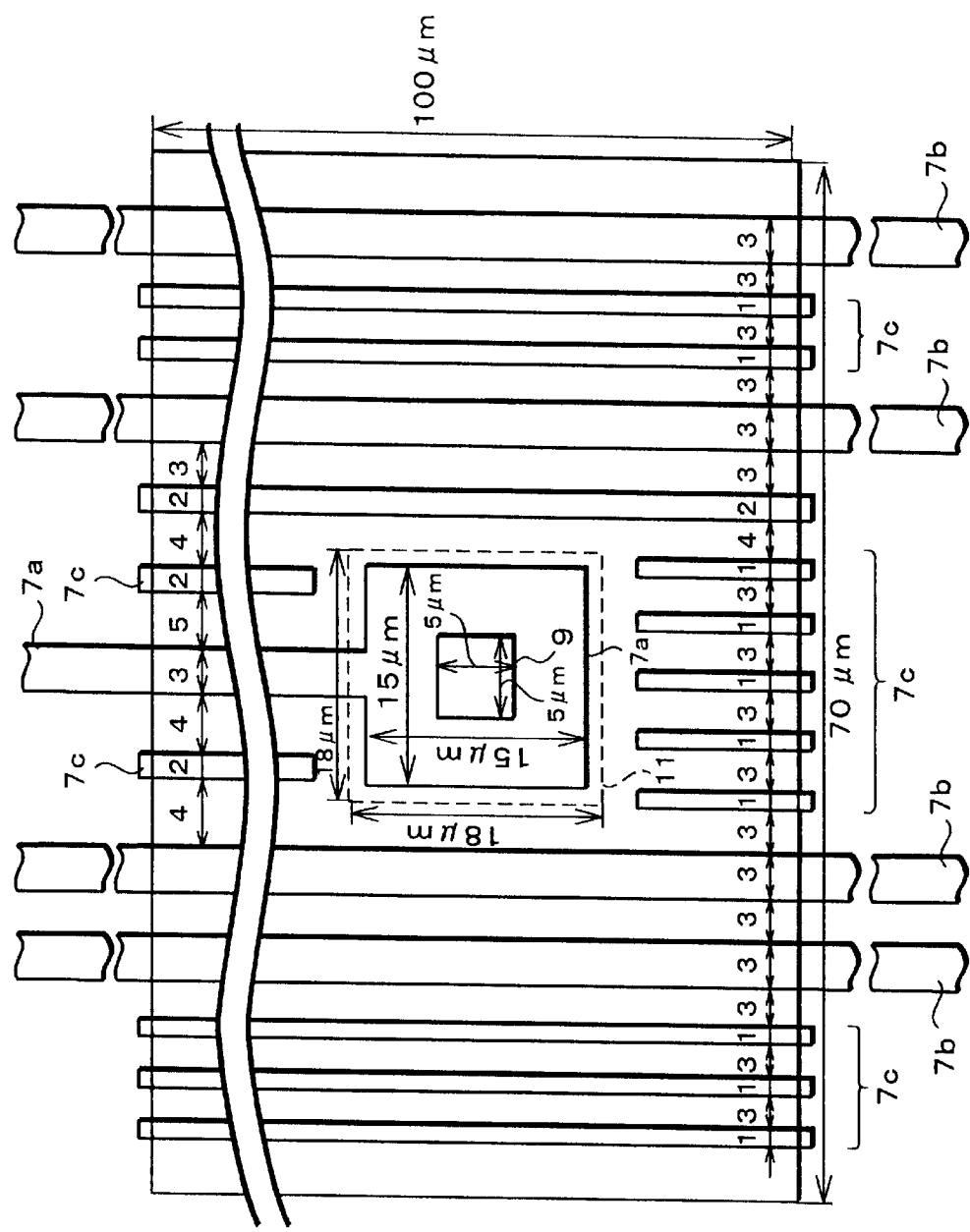
FIG. 17 is a plan view showing an example of design dimensions in the semiconductor integrated circuit in FIG. 16A.

Referring to FIGS. 16A, 16B, and 17, the following description will describe still another embodiment of the present invention. The members having the same structure (function) as those in the first and the second embodiments will be designated by the same reference numerals and their description will be omitted.

In the second embodiment, there is a possibility that the following problem might be caused in some cases.

Even when a plurality of wires 7b of the second wiring layer 7, located below the insulation films (the protection film 8 and the polyimide 10) placed on each side of the wire 7a of the second wiring layer 7 which is joined to the bonding pad 14, are provided on each side of the wire 7a, as described in the second embodiment, there may be cases where the wiring interval of the second wiring layer 7 becomes relatively wide (for example, not less than 7 $\mu$m) for design reasons. The wiring interval of the second wiring layer 7 refers to the interval between the wire 7a and the wire 7b, or the interval between the adjacent wires 7b. Especially, when the wiring interval of the second wiring layer 7 is not uniform for design reasons, it is likely that some part of the second wiring layer 7 may have a relatively wide wiring interval.

In this manner, in the case where there is a part in the second wiring layer 7 in which the wiring interval is relatively wide when the wires 7a and 7b of the second wiring layer 7 are formed, it means that there is a large-sized concave section on the surface. As a result, when forming the protection film 8 and the polyimide film 10 in this order, the polyimide 10 comes to have a rough surface. When the bonding pad 14 is formed on the rough surface of the polyimide 10, the surface of the bonding pad 14 also becomes rough. When carrying out a processing to press an inner lead to the rough surface of the bonding pad 14 under a certain pressure, and to connect the inner lead to the bonding pad 14 (inner lead bonding), the contact area between the inner lead and the bonding pad 14 becomes smaller. Thus, the electrical resistance between the inner lead and the bonding pad 14 becomes greater, and what is worse, there may be cases where the inner lead and the bonding pad 14 are separated.

The present embodiment has an object to reduce the electrical resistance between the inner lead and the bonding pad 14 by smoothing the surface roughness of the polyimide film 10 and the surface roughness of the bonding pad 14, and to improve the adhesiveness between the inner lead and the bonding pad 14.

To achieve the foregoing object, a semiconductor integrated circuit (semiconductor device) of the present embodiment is arranged such that the second wiring layer 7 further includes dummy wires 7c, which are not involved in device operation, in the region underlying the bonding pad 14, in addition to the wires 7a and 7b which are involved in the device operation. The foregoing device operation means the operation of the semiconductor element (the main body of the semiconductor device) 20 and the operation of an external device such as another semiconductor element, etc., which is not shown. Further, in the semiconductor integrated circuit (semiconductor device) of the present embodiment, a convex section 8c corresponding to the dummy wire 7c is formed on the surface of the protection film 8 on the side of the polyimide film 10, in addition to the convex section 8b corresponding to the wire 7b.

In the structure of the present embodiment, by providing the dummy wires 7c, when the protection film 8 and the polyimide film 10 are formed in this order after the formation of the second wiring layer 7 including the dummy wires 7c, the surface roughness of the polyimide film 10 is smoothed and the surface of the polyimide film 10 is planarized. Therefore, it becomes possible to planarize the surface of the bonding pad 14 when forming the bonding pad 14 on the polyimide film 10 having the planarized surface.

As a result, the electrical resistance between the inner lead and the bonding pad 14 can be reduced, and the adhesiveness between the inner lead and the bonding pad 14 can be further improved.

Further, it is desirable to form the convex section 8b of the protection film 8 on the wire 7b and the convex section 8c of the protection film 8 on the dummy wire 7c in an overhang shape. With such a structure, the polyimide film 10 (an organic polymeric film) is also deposited to constricted sections of the convex sections 8b and 8c formed in the overhang shape. Therefore, the convex sections 8b and 8c of the protection film 8 and the polyimide film 10 deposited at the constricted sections closely engage one another, further improving the adhesiveness between the protection film 8 and the organic polymeric film. Incidentally, the overhang shape described here is the same as the form described in the second embodiment.

Referring to FIGS. 1GA and 16B, the following description will describe the semiconductor integrated circuit of the present embodiment. FIG. 16A is a plan view, and FIG. 16B is a cross-sectional view taken along a line B–B' in FIG. 16A. Here, since the structure and the forming process of the semiconductor integrated circuit of the present embodiment for the part below the second wiring layer 7 are the identical to those of the semiconductor integrated circuit shown in FIG. 1, the explanation on the identical part will be omitted. The explanation on the part common to the second embodiment (FIG. 13) will also be omitted. Besides, in FIGS. 16A and 16B, the SOG film 4 and the part below the SOG film 4 are omitted.

The semiconductor integrated circuit of the present embodiment is structured such that, as in the structure in the second embodiment, the second wiring layer 7 includes the wire 7a joined to the bonding pad 14 and the wires 7b insulated from the bonding pad 14, in the region underlying the bonding pad 14. A plurality of the wire 7b are provided on each side of the wire 7a. The difference from the structure of the second embodiment is that the dummy wires 7c are provided between the wires 7a and 7b of the second wiring layer 7.

As shown in FIGS. 16A and 16B, the protection film 8 and the polyimide film 10 are formed between the wires 7b of the second wiring layer 7 and the bonding pad 14. The opening sections 9 and 11 are provided in the protection film 8 and the polyimide film 10, respectively. Via the opening sections 9 and 11, the wire 7a of the second wiring layer 7 and the bonding pad 14 are joined. The wires 7b of the second wiring layer 7 are provided in the region underlying the bonding pad 14, and below the insulation films made up of the protection film 8 and the polyimide film 10. The wires 7b of the second wiring layer 7 are connected to other bonding pads or other semiconductor elements (device elements), which are not shown, respectively. The wires 7b of the second wiring layer 7 are involved in the operation of the other semiconductor elements (device operation), which are not shown. Further, two wires 7b of the second wiring layer 7 are provided in parallel on the respective sides of the wire 7a of the second wiring layer 7, which is joined to the bonding pad 14. The wire 7a of the second wiring layer 7, which is joined to the bonding pad 14, is located at a position underlying the center of the bonding pad 14. The wires 7b of the second wiring layer 7 is formed parallel to the wire 7a of the second wiring layer 7.

Here, as shown in FIG. 17, it is determined that the bonding pad 14 has a width (the dimension in the direction orthogonal to the wires 7a and 7b) of 70 $\mu$m and a depth (the dimension in the direction parallel to the wires 7a and 7b) of 100 μm. The wire width of the wires 7a and 7b of the second wiring layer 7 is set at 3 μm. As for the intervals of the wires 7a and 7b of the second wiring layer 7, the interval between the wires 7b on the left side of the wire 7a is set at 3 μm, the interval between the wires 7b on the right side of the wire 7a is set at 11 μm, the interval between the wire 7a and the wire 7b on the left side of the wire 7a is set at 10 μm, and the interval between the wire 7a and the wire 7b on the right side of the wire 7a is set at 16 μm. Incidentally, the dimensions shown in FIG. 17 are all expressed in micrometers (μm). In such a manner, the wires 7a and 7b of the second wiring layer 7 are provided at the different intervals, and there are relatively long intervals not less than 11 μm and relatively short intervals of 3 μm.

Hence, in the present embodiment, the dummy wires 7c are formed in the intervals between the wires 7a and 7b and in the intervals between the adjacent wires 7b which are longer than the minimum interval, so that the wiring intervals of the second wiring layer 7 become almost the same as the minimum interval among the intervals between the wires 7a and 7b and between the adjacent wires 7b.

In the example shown in FIGS. 16A and 16B, the minimum interval among the wiring intervals between the wires 7a and 7b and the wiring intervals between the adjacent wires 7b is 3 μm. Therefore, in the example shown in FIG. 16A and 16B, the dummy wires 7c are formed, with the wire width changed, so that the wiring intervals of the second wiring layer 7 become 3 μm, and thus the wiring intervals of the second wiring layer 7 become 3 μm.

In this manner, by forming the dummy wires 7c in the intervals between the wires 7a and 7b and in the intervals between the adjacent wires 7b which are longer than the minimum interval among the intervals between the wires 7a and 7b and between the adjacent wires 7b, the wiring intervals of the second wiring layer 7 become uniform and very small. With this structure, when the protection film 8 and the polyimide film 10 are formed in this order after the formation of the second wiring layer 7 including the dummy wires 7c, the surface roughness of the polyimide film 10 is smoothed and the surface of the polyimide film 10 is planarized. Therefore, since the surface of the bonding pad 14 (the surface to which inner lead bonding is carried out) is planarized when forming the bonding pad 14 on the polyimide film 10 having the planarized surface, the electrical resistance between the inner lead and the bonding pad 14 can be reduced, and further, the adhesiveness between the inner lead and the bonding pad 14 can be improved. Furthermore, in the present embodiment, by forming the convex sections 8b and 8c of the overhang shape on the protection film 8 at the positions corresponding to the positions of the wires 7b and the dummy wires 7c, respectively, the adhesiveness at the interface between the protection film 8 and the polyimide film 10 is further improved.

It is preferable that the wiring intervals of the second wiring layer 7 (the intervals between the wires 7a, 7b, and the dummy wires 7c) are relatively short, specifically, less than 7 μm. Therefore, when the minimum interval among the intervals between the wires 7a and 7b and between the adjacent wires 7b is relatively long, specifically, not less than 7 μm, it is desirable to form the dummy wires 7c also in the intervals between the wires 7a and 7b (between the wire 7a and the wires 7b and between the adjacent wires 7b) having the minimum interval. It is most preferable that the wiring intervals of the second wiring layer 7 are not more than 3 μm. Further, although the wiring intervals of the second wiring layer 7 are preferably set shorter, it is not preferable to set them too short, because the convex sections 8b and 8c of the protection film 8 are combined and disappear in such a case. Consequently, the minimum wiring interval of the second wiring layer 7 should be determined so as to maintain the convex sections 8b and 8c. When the intervals between the wires 7a and 7b of the second wiring layer 7 satisfy the foregoing condition (less than 7 μm, more preferably not more than 3 μm), there is no need to provide the dummy wires 7c.

Here, although the intervals between the wires 7a and 7b and the dummy wires 7c of the second wiring layer 7 are set at less than 7 μm, the intervals between the wires 7a and 7b and the dummy wires 7c (7 μm) are determined by the thickness of the second wiring layer 7, the width of the wires 7a and 7b and the dummy wires 7c of the second wiring layer 7, and the thickness of the protection film 8. Therefore, if the thickness of the second wiring layer 7, the width of the wires 7a and 7b and the dummy wires 7c of the second wiring layer 7, and the thickness of the protection film 8 vary, the maximum value of the intervals between the wires 7a and 7b and the dummy wires 7c of the second wiring layer 7 also varies accordingly.

Next, the following description will describe processes from a process for forming the second wiring layer 7 to a process for forming the bonding pad 14.

A conductive film for forming the second wiring layer 7 made up of aluminum, etc. is deposited with a thickness of 1,250 nm on the inter-layer insulation film 6. Then, patterning is provided on the conductive film so that it has a predetermined wiring pattern, thus the wires 7a and 7b and the dummy wires 7c of the second wiring layer 7 are formed simultaneously. Next, the protection film 8 for protecting the second wiring layer 7 is formed so as to cover the wires 7a and 7b and the dummy wires 7c of the second wiring layer 7. In the present embodiment, a silicon oxide film with a thickness of 400 nm and a silicon nitride film with a thickness of 720 nm are formed respectively by the plasma CVD method in this order, and adopted as the protection film 8. Here, the convex sections 8b and 8c of the protection film 8 can be easily formed in the overhang shape by using, for example, a plasma CVD device providing relatively low step coverage.

Then, the opening section 9 with a size of 5 μm×5 μm is formed at a predetermined position in the protection film 8. Here, the opening section 9 is formed only at a position where the wire 7a of the second wiring layer 7 is joined to the bonding pad 14. Next, the polyimide film 10 with a thickness of 2,000 nm is formed by coating. Then, the opening section 11 is formed in the polyimide film 10 so as to surround the opening section 9.

Next, a TiW film with a thickness of 250 nm is deposited as the barrier metal 12, and gold with a thickness of 1,000 nm is deposited by the plating method. Then, the deposited gold is processed to form the gold bump 13 with a size of 70 μm×100 μm. Next, an unnecessary part of the barrier metal 12 is removed, using the gold bump 13 as a mask, to form the bonding pad 14 made up of the barrier metal 12 and the gold bump 13. Consequently, the semiconductor integrated circuit shown in FIGS. 16A and 16B is completed.

Fourth Embodiment

Figure 18:
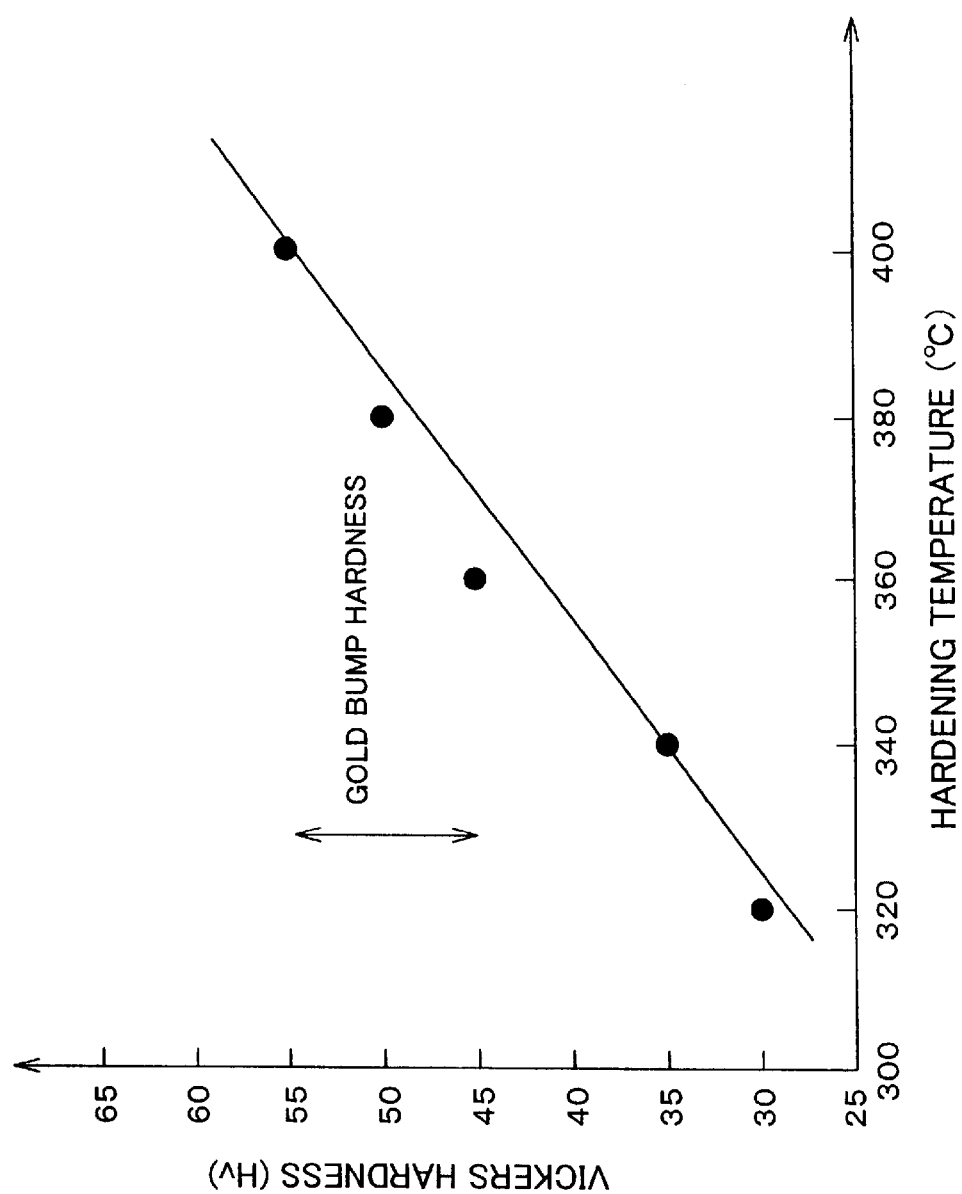
FIG. 18 is a graph showing a change in a Vickers hardness of a polyimide film in response to hardening temperature.

Referring to FIG. 18, the following description will describe still another embodiment of, the present invention. The members having the same structure (function) as those in the first embodiments will be designated by the same reference numerals and their description will be omitted.

In the first embodiment, when the Vickers hardness of the polyimide film 10 as an organic polymeric film is not adjusted, there is a possibility that the following problem might be caused.

It is generally known that, when forming the bonding pad 14 made up of the barrier metal 12 and the gold bump 13 according to the first embodiment, stress is applied to the barrier metal 12 during its formation process, warping the wafer (the whole substrate in course of manufacture, including the silicon substrate 1, the first wiring layer 2, the inter-layer insulation film 6, the second wiring layer 7, the protection film 8, the polyimide film 10, etc.) itself. When the gold bump 13 is formed by the plating method with the wafer warped, and an unnecessary part of the barrier metal 12 is removed using the gold bump 13 as a mask, the barrier metal 12 is separated on the wafer. As a result, the stress applied to the barrier metal 12 is relieved, and the warped wafer returns to the normal flat state. If the Vickers hardness of the polyimide film 10 is low when such a deformation of the wafer (the warping and flattening of the wafer) occurs, the polyimide film 10 expands when the wafer is warped (when forming the barrier metal 12), and shrinks when the warped wafer returns to the normal flat state (when removing the unnecessary part of the barrier metal 12), which might result in causing a crack in the polyimide film 10. There may be cases where the crack caused in the polyimide film 10 brings about the phenomenon that the bonding pad 14 is separated from the polyimide film 10 (pad-separating defect).

To avoid such a phenomenon, the present embodiment has an object to prevent the polyimide film (the organic polymeric film) 10 from being cracked due to the deformation of the wafer (the warping and flattening of the wafer) incident to the formation of the barrier metal 12.

To achieve the foregoing object, a semiconductor integrated circuit (semiconductor device) of the present embodiment is arranged such that the Vickers hardness of the polyimide film (the organic polymeric film) 10 is determined at a value at least close to the Vickers hardness of the bonding pad 14, specifically not less than two thirds of that of the bonding pad 14, more preferably not less than that of the bonding pad 14. Except that the Vickers hardness of the polyimide film 10 is adjusted, the semiconductor integrated circuit of the present embodiment has the same structure as that of the semiconductor integrated circuit of the first embodiment.

In the present embodiment, by determining the Vickers hardness of the polyimide film (the organic polymeric film) 10 at a value close to that of the bonding pad 14 as described above, it becomes possible to prevent the polyimide film 10 from being cracked due to the deformation of the wafer (the warping and flattening of the wafer) incident to the formation of the barrier metal 12.

It can be regarded that the Vickers hardness of the bonding pad 14 is equal to the Vickers hardness of a main material constituting the bonding pad 14, that is, in this case, the Vickers hardness of gold constituting the gold bump 13. Since the Vickers hardness of gold is from 45 to 55, to provide the polyimide film 10 having the Vickers hardness not less than two thirds of that of the bonding pad 14, the Vickers hardness of the polyimide film 10 should be, at least, not less than 30. Besides, to provide the polyimide film 10 having the Vickers hardness not less than that of the bonding pad 14, the Vickers hardness of the polyimide film 10 should be not less than 45. Therefore, in the present embodiment, the Vickers hardness of the polyimide film 10 is determined at not less than 30, preferable not less than 45.

Next, the following description will describe a method for forming the polyimide film 10 having the Vickers hardness close to that of the bonding pad 14. Incidentally, the process for manufacturing the semiconductor integrated circuit of the present embodiment is the same as that in the first embodiment, except the process for forming the polyimide film 10.

First, a general polyimide, that is, a polyamic acid which is a precursor of a thermo-setting condensed polyimide resin, is solved into a polar solvent (for example, N-methyl pyrrolidone) so as to prepare a polyamic acid solution. Then, the wafer (silicon oxide film 5 and the second wiring layer 7) is coated all over with the polyamic acid solution by spin coating, and a polyamic acid film is formed. Next, a position on the polyamic acid film for joining the bonding pad 14 with the wire 7a of the second wiring layer 7 is opened to form the opening section 9, then the solvent is vaporized at 110° C. Next, the polyamic acid film is heated at not less than 320° C., more preferably at the temperature within a range of 360° C. to 400° C., causing an imidization reaction (hydration condensation reaction) of the polyamic acid and hardening the polyamic acid film. Thus, the polyimide film 10 made with the condensed polyimide resin is formed.

In such a manner, the Vickers hardness of the polyimide film 10 can be made to have a value close to that of the bonding pad 14 by setting the temperature for the imidization reaction of the polyamic acid film at not less than 320° C.

This is because the Vickers hardness of the polyimide film 10 formed by the thermal hardening of the polyamic acid film increases with the increase of the temperature for hardening the polyamic acid film (the temperature for imidization reaction), as shown in FIG. 18. Here, the Vickers hardness (Hv) shown in FIG. 18 is measured in the micro-hardness test in which the test load is changed within a range of 9.8 mN (1 gf) to 4.9 N (500 gf).

As obvious in the result shown in FIG. 18, by setting the temperature for hardening the polyamic acid film at not less than 320° C., the polyimide film 10 is allowed to have the Vickers hardness not less than 30, and not less than two thirds of that of the gold bump 13. Consequently, it becomes possible to prevent the polyimide film 10 from being cracked due to the deformation of the wafer (the warping and flattening of the wafer) incident to the formation of the barrier metal 12. Further, as obvious in the result shown in FIG. 18, by setting the temperature for hardening the polyamic acid film within a range of 360° C. to 400° C., the polyimide film 10 is allowed to have the Vickers hardness within a range of 45 to 55, and not less than that of the gold bump 13. Consequently, it becomes possible to further surely prevent the polyimide film 10 from being cracked due to the deformation of the wafer (the warping and flattening of the wafer) incident to the formation of the barrier metal 12.

Incidentally, the temperature for hardening the polyamic acid film should be less than 410° C., because aluminum, etc. constituting the second wiring layer 7 are melted if the temperature not less than 410° C. is applied to harden the polyamic acid film. Thus, the maximum Vickers hardness of the polyimide film 10 is around 60.

As has been described, a semiconductor device of the present invention is structured so as to include:

a semiconductor substrate having an active region where a semiconductor element is formed;

a first wiring layer formed on the semiconductor substrate and electrically connected with the active region;

a second wiring layer formed on the first wiring layer via an inter-layer insulation film; and a bonding pad for electrical connection with an external section, at least a part of which is formed so as to overlie the active region, wherein the second wiring layer has a plurality of wires in a region underlying the bonding pad, in which a part of the wires is joined to the bonding pad, and other wires are insulated from the bonding pad by an insulation film formed between the other wires and the bonding pad.

According to the foregoing structure, a plurality of wires can be provided in the region underlying the bonding pad, where only one wire can be provided in a semiconductor device with a two-layer structure having a conventional area pad as shown in FIGS. 8, 10, 11A and 11B. Among the plurality of wires, the wires except that joined to the bonding pad are insulated from the bonding pad by the insulation film.

With this structure, it becomes possible to provide wires which should be insulated from the bonding pad, which are bypassed to avoid a region below the bonding pad in the semiconductor device with a two-layer structure having a conventional area pad, in the region underlying the bonding pad (the region below the bonding pad). For example, when the bonding pad is provided in a region overlying an active region (a region above an active region) of each of three adjacent semiconductor elements in a semiconductor integrated circuit, a second wire connecting the semiconductor elements at the both ends can be provided in a region underlying the bonding pad in the middle. Thus, since there is no need to bypass wires, the area of the wiring region can be reduced, and chip size reduction can be achieved.

Further, there is no need in this structure to design the wiring between semiconductor elements considering the position of the bonding pad, or, on the contrary, to specify the position of the bonding pad considering the wiring between the semiconductor elements, etc., which enhances the flexibility in providing the wiring between the semiconductor elements, etc. as well as the flexibility in the location of the bonding pad.

Besides, compared with the conventional semiconductor device in which the bonding pad is provided on the perimeter of a chip, where no wires are provided, so as to avoid an active region, considering the position of the wires between the semiconductor elements, etc., there is no need in this structure to provide a region exclusive for the bonding pad on the perimeter of a chip (a region where no wires are provided). Therefore, compared with the conventional semiconductor device, the area of the wiring region can be reduced, and chip size reduction can be achieved in the foregoing structure.

Figures 12A, 12B:
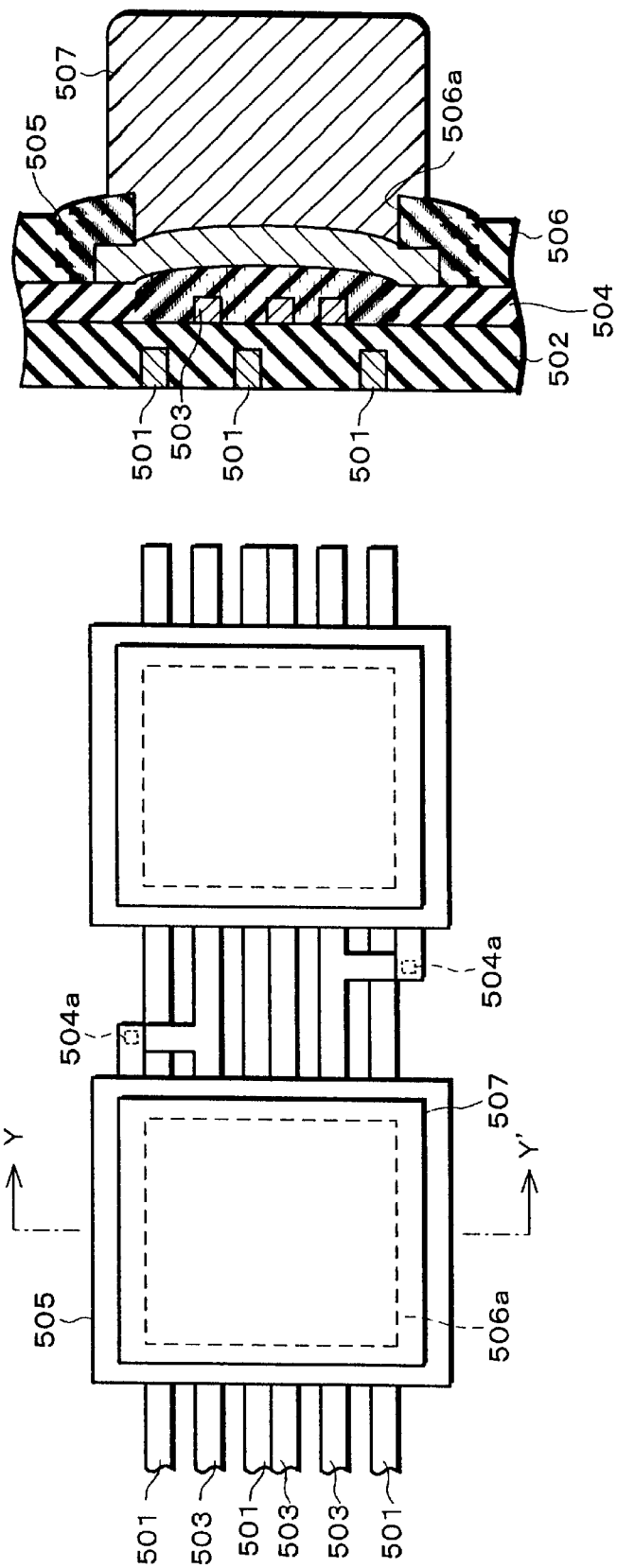
FIG. 12A is a schematic cross-sectional view showing still another example of a conventional semiconductor device, schematically showing the state of wiring in the semiconductor device.
FIG. 12B is a cross-sectional view taken along a line Y–Y' in the semiconductor device in FIG. 12A.

Furthermore, compared with the semiconductor device with a three-layer structure having the conventional area pad as shown in FIGS. 12A and 12B, the bonding pad can be directly joined to the second wiring layer without a third wiring layer in between in the foregoing structure, which eliminates the need for the third wiring layer and a protection film covering the third wiring layer. Therefore, processes for manufacturing the third wiring layer and the protection film covering the third wiring layer can be omitted, and the manufacturing process can be shortened. Consequently, production efficiency can be improved and manufacturing cost can be reduced.

Therefore, according to the foregoing structure, productivity improvement and cost reduction can be achieved, the device can be downsized, and the flexibility in providing the wiring between semiconductor elements, etc. and in the location of the bonding pad can be enhanced.

Incidentally, the wordings "overlie" and "underlie" mean that an orthogonal projection of a section projected on a semiconductor substrate matches that of another section projected on the same semiconductor substrate.

It is preferable that the insulation film includes an organic polymeric film for relieving an impact applied to the second wiring layer from the side of the bonding pad.

When a part of the second wiring layer is used as a bonding pad, as in the conventional technique disclosed in Japanese Unexamined Patent Publication No. 1-91439/1989, a crack is prone to occur in the second wiring layer due to mechanical stress applied to the bonding pad during wire bonding, which may cause a break in the wiring of the second wiring layer. Besides, in some cases, a semiconductor element might be destroyed by the mechanical stress applied to the bonding pad when performing wire bonding.

However, with the foregoing preferable structure, the impact applied to the second wiring layer when performing bonding can be absorbed by the organic polymeric film. Especially, the impact applied to the wires except the wire joined to the bonding pad, among the wires provided in the region underlying the bonding pad, can be absorbed. As a result, the foregoing structure can prevent cracking in the second wiring layer, which may cause a break. Besides, in the foregoing structure, the impact applied to the semiconductor element when performing bonding can also be absorbed, and thus the destruction of the semiconductor element can be prevented.

Especially, even when a plurality of wires are provided in the region underlying the bonding pad as in the structure of the present invention, the prevention of cracking and the impact absorption during bonding as described above can be sufficiently performed by using an organic polymeric film as the insulation film.

It is more preferable that the insulation film includes not only the organic polymeric film but also an inorganic insulation film, and it is particularly preferable that, in that case, the inorganic insulation film is formed between the organic polymeric film and the second wiring layer.

It is preferable that the organic polymeric film is a polyimide film. With this structure, the impact applied to the second wiring layer and the semiconductor element during bonding can be absorbed with more reliability. Consequently, a break in the second wiring layer and the destruction of the semiconductor element can be prevented with more reliability.

It is preferable that the Vickers hardness of the organic polymeric film is not less than two thirds of that of the bonding pad.

According to the foregoing structure, the organic polymeric film cannot be easily expanded and contracted, preventing a crack from occurring in the organic polymeric film. Therefore, the foregoing structure can prevent the occurrence of the phenomenon in which the bonding pad is separated from the organic polymeric film due to the cracking of the organic polymeric film. Especially, when a high melting point metal layer is completed by a method in which the high melting point metal layer is first formed on a surface including the jointed section between the bonding pad and the second wiring layer, then an unnecessary part of the high melting point metal layer is removed, the wafer is warped by the stress applied when forming the high melting point metal layer, then the high melting point metal layer is separated when the unnecessary part of the high melting point metal layer is removed and the warped wafer returns to the normal flat state. When the wafer is warped then flattened in such a manner, if the Vickers hardness of the organic polymeric film is low, the organic polymeric film expands and contracts according to such a deformation of the wafer, and a crack might be caused in the organic polymeric film. The foregoing structure can especially prevent a cracking of the organic polymeric film due to the warping of the wafer caused during a process for forming the high melting point metal layer.

Incidentally, the Vickers hardness (Hv) is a value obtained by dividing a test load (kgf) applied when forming an indentation on a tested surface by the surface area (mm²) of a permanent indentation derived from the length of the diagonal line of the permanent indentation, using a diamond pyramid indenter with an angle between the opposite faces of 136°.

It is preferable that the organic polymeric film has an opening section for joining a part of the wires of the second wiring layer and the bonding pad, and that an inner wall surrounding the opening section is inclined to be spread outward as it approaches the bonding pad.

According to the foregoing structure, a step at the base for the bonding pad can be sloped, and a step at the bonding pad can also be sloped, therefore a connection failure during bonding can be prevented. Besides, since the diameter of the opening section becomes large as a whole in the foregoing structure, when the part of the bonding pad joined to the second wiring layer is made of a high melting point metal layer and the other part of the bonding pad is made of gold, the foregoing structure can prevent a phenomenon that the high melting point metal layer has a break. Consequently, the foregoing structure can prevent a defect such that gold and a conductive material constituting the second wiring layer contact each other and react, making the wiring resistance of the second wiring layer nonuniform.

In a structure as described above such that the inner wall of the organic polymeric film is inclined, it is more preferable that the organic polymeric film surrounding the opening section is formed in a bird's beak shape, that is, in a shape such that the inclination angle of the inner wall with respect to the surface of the inter-layer insulation film serving as a base becomes gentler as the wall approaches the bonding pad. With this structure, a step at the base for the bonding pad can be further gently sloped, and a step at the bonding pad can also be further gently sloped, therefore the prevention of a connection failure during bonding is further ensured.

It is preferable that, in the structure including the organic polymeric film, the insulation film further includes an protection film made of an inorganic insulating material provided between the organic polymeric film and the second wiring layer, and that a convex section corresponding to each of the foregoing other wires is provided on the surface of the protection film formed on the second wiring layer, the surface being on the side of the organic polymeric film.

According to the foregoing structure, by providing the protection film made of an inorganic insulating material between the organic polymeric film and the second wiring layer, the second wiring layer can be protected from moisture, and the mechanical strength of the insulation film can be improved. Thus, the foregoing structure can more stably maintain the insulation state between the bonding pad and the other wires of the second wiring layer, and electrical characteristics of the second wiring layer. Besides, by providing the convex section on the surface of the protection film on the second wiring layer on the side of the organic polymeric film, the contact surface between the protection film and the organic polymeric film becomes larger, preventing the delamination between the protection film and the organic polymeric film.

It is preferable that the convex section is formed in an overhang shape.

According to the foregoing structure, the convex section of the overhang shape on the protection film and the organic polymeric film formed at a constricted section of the convex section closely engage each other, further preventing the delamination between the protection film and the organic polymeric film.

The other wires of the second wiring layer may be provided respectively on the both sides of the wire of the second wiring layer joined to the bonding pad, in the region underlying the bonding pad.

According to the foregoing structure, the number of the convex section formed on the protection film is increased, providing a larger contact surface between the protection film and the organic polymeric film. As a result, the delamination between the protection film and the organic polymeric film can be further prevented.

It is preferable that, in the structure where the convex section is formed on the protection film, the interval between the wires of the second wiring layer provided in the region underlying the bonding pad is less than 7 μm.

According to the foregoing structure, the interval between the convex sections of the protection film can be reduced, smoothing the surface roughness of the bonding pad. Consequently, an increase in electrical resistance and a separation of an external lead from the bonding pad when connecting the lead with the bonding pad can be prevented.

The other wires of the second wiring layer may include dummy wires not involved in the operation of the semiconductor device and an external device, in addition to the wires for operation involved in the operation of the semiconductor device and the external device.

According to the foregoing structure, even when there is a low number of the wires for operation involved in the operation of the semiconductor device and the external device for design reasons, the delamination between the protection film and the organic polymeric film can be further prevented by providing more wires. Besides, with the foregoing structure, even when there is a low number of the wires for operation involved in the operation of the semiconductor device and the external device for design reasons, the surface roughness of the bonding pad can be smoothed by providing the wires of the second wiring layer located in the region underlying the bonding pad at intervals less than 7 μm. Consequently, an increase in electrical resistance and a separation of an external lead from the bonding pad when connecting the lead with the bonding pad can be further prevented.

Therefore, according to the foregoing structure, the delamination between the protection film and the organic polymeric film, and an increase in electrical resistance and a separation of an external lead from the bonding pad when connecting the lead with the bonding pad can be further prevented, while maintaining the flexibility of the wiring design (the number of the wires and the location).

It is preferable that the bonding pad is made up of the high melting point metal layer formed on the section joined with the wire, and an exposed gold layer which formed on the high melting point metal layer.

When the bonding pad is made of, for example, gold only, there is a possibility that, due to mutual diffusion between gold and the second wiring layer, a low resistance material constituting the second wiring layer such as aluminum and gold react to form a compound between metals, making the wiring resistance of the second wiring layer nonuniform. Besides, for example, when the bonding pad is made of gold only and the insulation film contacting the bonding pad is a polyimide film, there is a problem that the adhesiveness between the bonding pad and the insulation film is low.

On the contrary, in the foregoing structure, the high melting point metal layer is formed where the bonding pad joins to the wire, lying between the exposed gold layer and the second wiring layer. This structure can prevent the reaction between gold and the low resistance material constituting the second wiring layer such as aluminum due to mutual diffusion between gold and the second wiring layer, and the occurrence of a defect such as an nonuniform wiring resistance of the second wiring layer. Besides, since the high melting point metal can adhere to the polyimide film more closely than gold, the adhesiveness between the bonding pad and the insulation film can be improved. Further, the exposed section exposed is composed of gold, which is chemically the most stable metal, ensuring the connection between the bonding pad and an external section.

As has been described, a method for manufacturing a semiconductor device of the present invention includes the steps of:

forming a semiconductor element on a semiconductor substrate;

forming a first wiring layer so as to be partially joined to the semiconductor element;

forming an inter-layer insulation film having a via hole, on the first wiring layer;

forming a second wiring layer on the inter-layer insulation film and in the via hole;

forming an insulation film on the second wiring layer;

forming an opening section in the insulation film; and forming a bonding pad for electrical connection with an external section, by forming a metal film on the insulation film and in the opening section, wherein a plurality of wires are formed in the step of forming the second wiring layer;

the insulation film is formed so as to cover the plurality of wires in the step of forming the insulation film;

the opening section is formed so as to expose only a part of the plurality of wires covered with the insulation film, in the step of forming the opening section; and the bonding pad is formed so as to at least partially overlie the semiconductor element, and to overlie at least one of the wires covered with the insulation film, in the step of forming the bonding pad.

According to the foregoing method, a semiconductor device in which a plurality of wires are provided in a region underlying the bonding pad, where only one wire can be provided in a semiconductor device with a two-layer structure having a conventional area pad, can be obtained. Among the plurality of wires, those except the wire joined to the bonding pad is covered with the insulation film, so they are insulated from the bonding pad.

With this method, wires to be insulated from the bonding pad can be placed in the region underlying the bonding pad (the region below the bonding pad). Thus, since there is no need to bypass the wires, the area of the wiring region can be reduced, and chip size reduction can be achieved. Further, the flexibility in providing the wiring between the semiconductor elements, etc. and the flexibility in the location of the bonding pad can be enhanced.

Compared with the conventional semiconductor device in which the bonding pad is provided on the perimeter of a chip, where no wires are provided, so as to avoid an active region, considering the position of the wires between the semiconductor elements, etc., the area of the wiring region can be reduced, and chip size reduction can be achieved by the foregoing method.

Furthermore, according to the foregoing method, the bonding pad can be directly joined to the second wiring layer without a third wiring layer in between, which eliminates the need for the third wiring layer and a protection film covering the third wiring layer. Therefore, processes for manufacturing the third wiring layer and the protection film covering the third wiring layer can be omitted, and the manufacturing process can be shortened. Consequently, production efficiency can be improved and manufacturing cost can be reduced.

Therefore, according to the foregoing method, productivity improvement and cost reduction can be achieved, the device can be downsized, and the flexibility in providing the wiring between semiconductor elements, etc. and in the location of the bonding pad can be enhanced.

The foregoing method preferably includes the steps of forming an insulation film on the semiconductor substrate, and forming a contact hole in the insulation film, prior to the step of forming the first wiring layer.

The step of forming the first wiring layer preferably includes the steps of forming a first conductive film on the insulation film and in the contact hole, and forming the first wiring layer by processing the first conductive film. The step of forming the second wiring layer preferably includes the steps of forming a second conductive film on the inter-layer insulation film and in the via hole, and forming the second wiring layer by processing the second conductive film.

In the foregoing method, preferably, the step of forming the insulation film is a step of forming an inorganic insulation film as a protection film, and the step of forming the opening section is a step of forming a first opening section in the inorganic insulation film. After the step of forming the foregoing opening section, the foregoing method includes the steps of forming an organic polymeric film on the inorganic insulation film, for absorbing an impact applied to the second wiring layer during bonding from the side of the bonding pad; and forming a second opening section in the organic polymeric film, which includes the first opening section in the inorganic insulation film and is larger than the first opening section. Furthermore, in the preferable method, the step of forming the bonding pad preferably includes the steps of forming a metal film made of a metal which can adhere to the organic polymeric film closer than gold (preferably a high melting point metal), on the organic polymeric film, in the first opening section in the inorganic insulation film, and in the second opening section in the organic polymeric film; forming a gold bump covering the first opening section in the protection film (inorganic insulation film), at an area larger than that of the first opening section, by the plating method; and removing an unnecessary part of the metal film using the gold bump as a mask.

The step of forming the bonding pad preferably includes the steps of forming the high melting point metal film on the insulation film and in the opening section in the insulation film; forming the gold bump covering the opening section in the protection film, at an area larger than that of the opening section, by the plating method; and removing an unnecessary part of the high melting point metal film using the gold bump as a mask.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:

a semiconductor substrate having an active region where a semiconductor element is formed;

a first wiring layer formed on said semiconductor substrate and electrically connected with said active region;

a second wiring layer formed on said first wiring layer via an inter-layer insulation film; and a bonding pad for electrical connection with an external section, at least a part of which is formed so as to overlie said active region, wherein said second wiring layer has a plurality of wires in a region underlying said bonding pad, in which a part of the wires of the second wiring layer in the region is joined to said bonding pad, and other wires of the second wiring layer in the region are insulated from said bonding pad by an insulation film formed between the other wires and said bonding pad.

2. The semiconductor device of claim 1, wherein:

said insulation film includes an organic polymeric film for absorbing an impact applied to said second wiring layer from the side of s aid bonding pad.

3. The semiconductor device of claim 2, wherein:

said organic polymeric film is a polyimide film.

4. The semiconductor device of claim 2, wherein:

said organic polymeric film has a thickness within a range of 2 µm to 5 µm.

5. The semiconductor device of claim 2, wherein:

a Vickers hardness of said organic polymeric film is not less than two thirds of a Vickers hardness of said bonding pad.

6. The semiconductor device of claim 2, wherein:

said organic polymeric film has an opening section for joining a part of the wires of said second wiring layer with said bonding pad, and an inner wall surrounding said opening section is inclined to be spread outward as it approaches said bonding pad.

7. The semiconductor device of claim 6, wherein:

a cross section of said opening section in said organic polymeric film is formed in a bird's beak shape.

8. The semiconductor device of claim 2, wherein:

said organic polymeric film has an opening section for joining a part of the wires of said second wiring layer with said bonding pad; and a diameter of said opening section increases with distance from said semiconductor substrate.

9. The semiconductor device of claim 2, wherein:

said organic polymeric film has an opening section for joining a part of the wires of said second wiring layer with said bonding pad; and an interface between said bonding pad and said organic polymeric film surrounding said opening section is formed as an arc projecting toward said bonding pad.

10. The semiconductor device of claim 2, wherein:

said insulation film further includes a protection film, made of an inorganic insulation material, provided between said organic polymeric film and said second wiring layer; and a convex section corresponding to each of the other wires is provided on a surface of said protection film formed on said second wiring layer, the surface being on a side of said organic polymeric film.

11. The semiconductor device of claim 10, wherein:

said convex section is of an overhang shape.

12. The semiconductor device of claim 11, wherein an inequality $0.05\ \mu m \leq (X-Y)/2 \leq 0.2\ \mu m$ is satisfied, where X represents a maximum outer shape length of said convex section along a direction parallel to a substrate surface, and Y represents a length of a lowest part of said convex section along the direction.

13. The semiconductor device of claim 10, wherein:

the other wires are provided on respective sides of the wire joined to said bonding pad in the region underlying said bonding pad.

14. The semiconductor device of claim 10, wherein:

an interval between the wires of said second wiring layer provided in the region underlying said bonding pad is less than 7 µm.

15. The semiconductor device of claim 13, wherein:

the other wires include a dummy wire which is not involved in an operation of the semiconductor device and an external device, and wires for operation involved in the operation of the semiconductor device and the external device.

16. The semiconductor device of claim 1, wherein:

said bonding pad includes a high melting point metal layer formed on a section joined to the wire, and an exposed gold layer formed on said high melting point metal layer.

17. A semiconductor device comprising:

a semiconductor substrate having an active region where a semiconductor element is formed;

a first wiring layer formed on said semiconductor substrate and electrically connected with said active region;

a second wiring layer formed on said first wiring layer via an inter-layer insulation film; and a bonding pad for electrical connection with an external section, at least a part of which is formed so as to overlie said active region, wherein said second wiring layer has a plurality of wires in a region underlying said bonding pad, in which a part of the wires of the second wiring layer in the region is joined to said bonding pad, and other wires of the second wiring layer in the region are insulated from said bonding pad by an insulation film formed between the other wires and said bonding pad, and the other wires comprise a dummy wire which is not involved in operation of the semiconductor device and an external device, and wires for operation involved in operation of the semiconductor device and the external device.

18. A semiconductor device comprising:

a semiconductor substrate having an active region where a semiconductor element is formed;

a first wiring layer formed on said semiconductor substrate and electrically connected with said active region;

a second wiring layer formed on said first wiring layer via an inter-layer insulation film; and a bonding pad for electrical connection with an external section, at least a part of which is formed so as to overlie said active region, wherein said second wiring layer has a plurality of wires in a region underlying said bonding pad, in which a part of the wires of the second wiring layer in the region is joined to said bonding pad, and another wire of the second wiring layer in the region is insulated from said bonding pad by an insulation film formed between the another wire and said bonding pad.

* * * * *